(12) United States Patent
Hahn

(10) Patent No.: US 11,079,254 B2
(45) Date of Patent: Aug. 3, 2021

(54) MAGNET RANGEFINDER

(71) Applicant: Christopher James Hahn, Longmont, CO (US)

(72) Inventor: Christopher James Hahn, Longmont, CO (US)

(*) Notice: Subject to any disclaimer, the term of this patent is extended or adjusted under 35 U.S.C. 154(b) by 125 days.

(21) Appl. No.: 16/724,946

(22) Filed: Dec. 23, 2019

(65) Prior Publication Data

US 2020/0124445 A1  Apr. 23, 2020

Related U.S. Application Data

(63) Continuation-in-part of application No. 16/261,740, filed on Jan. 30, 2019, now Pat. No. 10,514,476.
(Continued)

(51) Int. Cl.
*G01D 5/14* (2006.01)
*G01R 33/00* (2006.01)
(Continued)

(52) U.S. Cl.
CPC .............. *G01D 5/145* (2013.01); *G01B 7/023* (2013.01); *G01R 33/0005* (2013.01); *G01R 33/072* (2013.01)

(58) Field of Classification Search
CPC ........ G01D 5/142; G01D 5/145; G01D 5/147; G01R 33/0011; G01R 33/06; G01R 33/07;
(Continued)

(56) References Cited

U.S. PATENT DOCUMENTS 4,293,814 A  10/1981 Boyer
4,717,864 A  1/1988 Fultz
(Continued)

OTHER PUBLICATIONS

Yang, A Hall Sensor-Based Three-Dimensional Displacement Measurement System for Miniature Magnetically Levitated Rotor, Dec. 2009, IEEE Sensors Journal (Year: 2009).*

*Primary Examiner* — Son T Le
*Assistant Examiner* — Dustin R Dickinson
(74) *Attorney, Agent, or Firm* — Thomas J. Lavan

(57) ABSTRACT

A device is provided. The device includes one or more of a radially-wound coil, a hall-effect sensor, a power source, and a control circuit. The radially-wound coil is configured to produce a first magnetic field in response to a periodic current applied to the coil. The hall-effect sensor includes a sensor output that indicates proximity of a magnet to the hall-effect sensor. The magnet provides a second magnetic field and the sensor output indicates proximity in response to a combination of a strength of the first magnetic field and a strength of the second magnetic field exceeds a trip level. The coil is in fixed proximity to the hall-effect sensor, and the current is configured to control a polarity of the first magnetic field to detect the magnet. The power source is coupled to the hall-effect sensor, and is configured to provide power that alternates between on and off voltages to the hall-effect sensor. The control circuit is coupled to the hall-effect sensor, and is configured to determine a time stamp that corresponds to a sample time the sensor output indicates the magnet is detected, sample a value that corresponds to the current at the sample time, and determine a sensed distance to the magnet from the sampled value.

20 Claims, 29 Drawing Sheets

Related U.S. Application Data

(60) Provisional application No. 62/721,502, filed on Aug. 22, 2018.

(51) Int. Cl.
 *G01R 33/07* (2006.01)
 *G01B 7/02* (2006.01)

(58) Field of Classification Search
 CPC .............. G01R 33/072; G01R 33/0017; G01R 33/0041; G01R 33/0005; G01V 3/081; H02K 11/215; G01B 7/14; G01B 7/003
 See application file for complete search history.

(56) References Cited

U.S. PATENT DOCUMENTS

| | | |
|---|---|---|
| 5,285,154 A | 2/1994 | Burreson |
| 5,705,924 A | 1/1998 | Jeffers |
| 5,986,450 A | 11/1999 | Haigh et al. |
| 6,002,350 A | 12/1999 | Checa et al. |
| 6,829,952 B2 | 12/2004 | Stanley et al. |
| 6,843,143 B2 | 1/2005 | Steele et al. |
| 7,082,823 B1 | 8/2006 | Shipman et al. |
| 7,301,334 B2 | 11/2007 | Shen et al. |
| 7,602,271 B2 | 10/2009 | York et al. |
| 7,764,154 B2 | 7/2010 | York et al. |
| 7,777,482 B2 | 8/2010 | Munz et al. |
| 7,876,186 B2 | 1/2011 | York et al. |
| 8,120,351 B2 | 2/2012 | Rettig et al. |
| 8,801,361 B2 | 8/2014 | Hawkins |
| 9,933,323 B2 | 4/2018 | Schweizer et al. |
| 10,012,518 B2 | 7/2018 | David et al. |
| 2004/0122334 A1 | 6/2004 | Yamashiro |
| 2014/0067306 A1* | 3/2014 | Oliver .................. G01C 25/005 702/92 |
| 2014/0218853 A1* | 8/2014 | Pance ................... G06F 1/1684 361/679.4 |
| 2014/0266159 A1 | 9/2014 | Heremans et al. |
| 2017/0284829 A1 | 10/2017 | Cai et al. |
| 2017/0307670 A1* | 10/2017 | Olsson .................. G01R 29/085 |
| 2018/0031628 A1 | 2/2018 | Ahrens et al. |

\* cited by examiner (1) Field Polarity Sympathetically Aligned; Magnet Not Detected (2) Field Polarity Sympathetically Aligned; Magnet Detected (1) 716 Trip Level Not Exceeded – Static Sensor Output (2) 716 Trip Level Exceeded – Active Sensor Output (1) Field Polarity Non-Sympathetically Aligned; Magnet Not Detected (2) Field Polarity Non-Sympathetically Aligned; Magnet Not Detected (1) 716 Trip Level Not Exceeded – Static Sensor Output (2) 716 Trip Level Not Exceeded – Static Sensor Output (1) Field Polarity Partially Sympathetically Aligned; Magnet Not Detected (2) Field Polarity Partially Sympathetically Aligned; Magnet Not Detected (1) 716 Trip Level Not Exceeded – Static Sensor Output (2) 716 Trip Level Not Exceeded – Static Sensor Output (1) Field Polarity Partially Sympathetically Aligned; Magnet Not Detected (2) Field Polarity Partially Sympathetically Aligned; Magnet Detected (1) 716 Trip Level Not Exceeded – Static Sensor Output (2) 716 Trip Level Exceeded – Active Sensor Output

MAGNET RANGEFINDER

CROSS REFERENCE TO RELATED APPLICATION(S)

This application is a Continuation-in-Part of application Ser. No. 16/261,740, filed Jan. 30, 2019, which claims priority to earlier filed provisional application No. 62/721,502 filed Aug. 22, 2018 and entitled "ADJUSTABLE SENSITIVITY MAGNET SENSOR", the entire contents of which are hereby incorporated by reference.

FIELD

The present application is directed to devices and method for sensing magnets. In particular, the present application is directed to methods and apparatuses for a magnet rangefinder.

BACKGROUND

Conventional position & proximity sensing technologies require benign environments—and/or transmitter/receiver pairs (photo sensors, for example). Such techniques may be constrained to pass the object between two parallel elements, such as, a receiver/transmitter pair. Several types of sensors have traditionally been used for various forms of object detection, including optical sensors, color sensors, touch sensors, ultrasonic sensors, infrared sensors, and Sonar and laser sensors.

Light sensors may be included in the proximity sensor category, and are simple sensors that change the voltage of photoresistors or photovoltaic cells in accordance with the amount of light detected. Light sensors may be, for example, used in very popular applications for autonomous robots that track a marked path.

With color sensors, different colors are reflected with different intensity, for example, an orange color reflects red light in an amount greater than a green color. Color sensors are in the same general category as light sensors, but with a few extra features that can be useful for applications where it is necessary to detect the presence of an object with a certain color or to detect the types of objects on surfaces.

Touch sensors may be included in the proximity sensors category and are designed to sense objects at a small distance with or without direct contact. These sensors are designed to detect changes in capacitance between the onboard electrodes and an object.

Ultrasonic sensors are designed to generate high frequency sound waves and receive an echo reflected by an object. These sensors are used in a wide range of applications and are very useful when it is not important to detect colors, surface textures, or transparency. Ultrasonic sensors may have the following advantages: the output value is linear with the distance between the sensor and the target, the sensor response is not dependent on the colors, transparency of objects, optical reflection properties, or by the surface texture of the object, they are designed for contact-free detection, sensors with digital (ON/OFF) outputs have excellent repeat sensing accuracy, they provide accurate detection of even small objects, and they may work in critical conditions such as dirt and dust. However, ultrasonic sensors may have the following disadvantages: they must view a high density surface for good results (e.g., a soft surface such as foam and cloth has low density and may absorb sound waves emitted by the sensor, they could experience false detection if some loud noises are received, they have a response time slightly less than other types of sensors, they have a minimum sensing distance, and some changes in the environment may affect the response of the sensor (temperature, humidity, pressure, etc.).

Infrared sensors measure infrared (IR) light that is transmitted in the environment to find objects by an IR light-emitting diode (LED). This type of sensor is very popular in navigation for object avoidance, distance measurements, or line following applications. IR sensors are very sensitive to IR lights and sunlight, which makes them useful for applications requiring great precision in spaces with low light. IR sensors may have the following advantages: they may detect infrared light over large areas, they may operate in real-time, they use non-visible light for detection, and they are inexpensive. Disadvantages of IR sensors is they are inherently very sensitive to IR lights and sunlight while be weak in sensing objects of darker colors such as black.

Sonar sensors may be used primarily in navigation for object detection, even for small objects. These sensors have high performance on the ground and in water. Laser sensors may be very useful for tracking and detection targets located at a long distances. The distance between sensor and target is measured by calculating the speed of light and the time to receive a return. Laser sensors are very precise in measurement.

SUMMARY

The present application is directed to solving disadvantages of the prior art. In accordance with embodiments of the present application, a device is provided. The device includes one or more of a radially-wound coil, a hall-effect sensor, a power source, and a control circuit. The radially-wound coil is configured to produce a first magnetic field in response to a periodic current applied to the coil. The hall-effect sensor includes a sensor output that indicates proximity of a magnet to the hall-effect sensor. The magnet provides a second magnetic field and the sensor output indicates proximity in response to a combination of a strength of the first magnetic field and a strength of the second magnetic field exceeds a trip level. The coil is in fixed proximity to the hall-effect sensor, and the current is configured to control a polarity of the first magnetic field to detect the magnet. The power source is coupled to the hall-effect sensor, and is configured to provide power that alternates between on and off voltages to the hall-effect sensor. The control circuit is coupled to the hall-effect sensor, and is configured to determine a time stamp that corresponds to a sample time the sensor output initially indicates detection of the magnet after the sensor output does not indicate detection of the magnet, sample a value that corresponds to the current at the sample time, and determine a sensed distance to the magnet from the sampled value.

In accordance with another embodiment of the present application, a system is provided. The system includes one or more of a sense circuit, a power source, a magnet, and a control circuit. The sense circuit includes a radially-wound coil configured to produce a first magnetic field in response to a current applied to the coil and a hall-effect sensor includes a sensor output that includes a trip level. The radially-wound coil is in fixed proximity to the hall-effect sensor. The power source is coupled to the hall-effect sensor, and is configured to provide power that alternates between on and off voltages to the hall-effect sensor. The magnet produces a second magnetic field, and is configured to move in one or more directions with respect to the hall-effect sensor. The sensor output indicates proximity of the magnet to the hall-effect sensor in response to a combination of a strength of the first magnetic field and a strength of the second magnetic field at the hall-effect sensor exceeds the trip level. The control circuit is coupled to the sense circuit, and is configured to produce the current to the radially-wound coil, modulate the current to control the polarity of the first magnetic field, sample the current at a sample time the sensor output initially indicates detection of the magnet after the sensor output does not indicate detection of the magnet, and determine a sensed distance to the magnet from the sample.

In accordance with yet another embodiment of the present application, a method is provided. The method includes one or more of providing power including an on voltage for an on time and an off voltage for an off time to a hall-effect sensor, producing, by a control circuit, a current to a radially-wound coil, producing a first magnetic field in the radially-wound coil by modulating the current, moving a magnet producing a second magnetic field within a detection range of the hall-effect sensor, indicating detection of the magnet by the sensor output in response to a combination of a strength of the first magnetic field and a strength of the second magnetic field exceeds a trip level of the hall-effect sensor, sampling the current at a time when the sensor output initially indicates detection of the magnet after not detecting the magnet, and determining a sensed distance to the magnet from the sample. The current provides a bias level for the hall-effect sensor in fixed proximity to the radially-wound coil, and the hall-effect sensor includes a sensor output. The trip level is higher than the bias level.

DETAILED DESCRIPTION

Magnetic object sensing presents several notable advantages over various alternatives. For example, an integrated transmitter/receiver pair at a common location may be used to detect a magnet without requiring the magnet to pass between the receiver and transmitter to be detected. In another example, a magnet or a magnet attached to an object may be detected in spite of intervening non-magnetic materials. Non-magnetic materials include clothing, wood, paper, plastics, glass, ceramics, and non-magnetized metals.

Existing magnetic sensors typically sense magnets over a range of a few (or perhaps tens of) milliTeslas. This means that a strong (larger/heavier) magnet may be required to trigger the sensor—and/or from a close distance. From this observation, the need to be able to tune the sensitivity of the magnetic-sensor is identified. The present application describes an apparatus that can sense small permanent magnets producing field strengths ranging from tens of milliTeslas to a few tens of microTeslas (i.e., fields on the order of field strength of the earth's magnetic field).

For most embodiments, the sensed element may be very lightweight compared to the weight of an object incorporating the sensed element. Sensing in most cases should further be non-contact sensing. However, conventional magnet sensing methods only operate over very small distances (typically less than one inch for either position or proximity), while reluctance approaches required a "flying magnet", traveling at high speed. (e.g., a magnet embedded in a tooth on a geared flywheel passing nearby to a hall-effect sensor). The present application meets these stated needs—permitting close tolerance positional sensing (down to zero-speed, or not moving)—over a range exceeding two feet. Additionally, moving objects at high relative velocities, non-linear movement paths, and acceleration/deceleration may be tracked.

Figure 1:
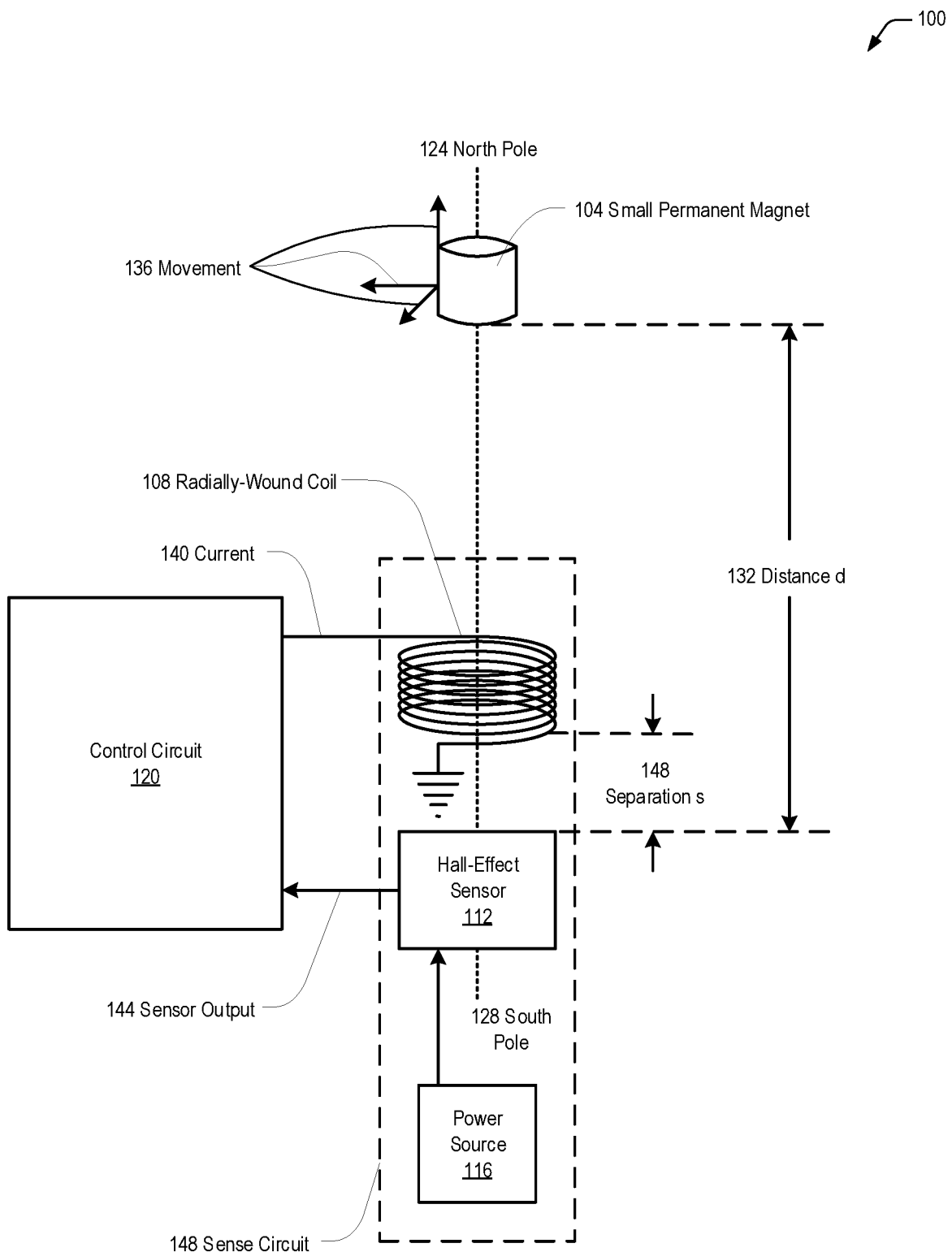
FIG. 1 is a diagram illustrating an adjustable sensitivity magnet sensor in accordance with embodiments of the present application.

Referring now to FIG. 1, a diagram illustrating an adjustable sensitivity magnet sensor 100 in accordance with embodiments of the present application is shown. The adjustable-sensitivity magnet sensor 100 includes a hall-effect sensor 112 powered by a power source 116. A hall-effect sensor 112 is a transducer that varies its output voltage in response to a magnetic field. Hall-effect sensors 112 are used for proximity switching, positioning, speed detection, and current sensing applications. In a hall-effect sensor 112, a thin strip of metal has a current applied along it. In the presence of a magnetic field, the electrons in the metal strip are deflected toward one edge, producing a voltage gradient across the short side of the strip (perpendicular to the feed current). Hall-effect sensors 112 have an advantage over inductive sensors in that, while inductive sensors respond to a changing magnetic field which induces current in a coil of wire and produces voltage at its output, hall-effect sensors 112 can detect static (non-changing) magnetic fields. In its simplest form, the sensor operates as an analog transducer, directly returning a voltage. Hall-effect sensors 112 have a specified trip point or trip level, which is a level of detected magnetic flux at which a sensor output 144 of the hall-effect sensor 112 indicates detection of a magnet or small permanent magnet 104. While a hall-effect sensor 112 by itself can detect magnets 104 having strong magnetic fields or in very close proximity, they are sometimes not as effective in detecting smaller magnets 104 having weaker magnetic fields or magnets 104 located at greater distances d 132 from the hall-effect sensor 112.

In order to increase the detection sensitivity of the hall-effect sensor 112, the hall-effect sensor 112 and power source 116 is combined with a radially-wound coil 108 to form a sense circuit 148. The radially-wound coil 108 produces a magnetic field of its own (first magnetic field) in response to a DC current 140 applied to the coil 108. The strength of the first magnetic field is determined by the DC current 140. The purpose of the radially-wound coil 108 is to bias the hall-effect sensor 112, through the first magnetic field, to a bias level slightly lower than the trip level of the hall-effect sensor 112. The concept is that a magnet 104 producing a second magnetic field will combine with the first magnetic field in such a way that the combination (sum) of the first magnetic field and the second magnetic field exceeds the trip level of the hall-effect sensor 112. Put another way, the strength of the second magnetic field (due to the magnet 104) trips the hall-effect sensor 112 and sensor output 144 if the strength of the second magnetic field is greater than the difference between the bias level and the trip level.

The magnet 104 may be static or moving 136 in one or more directions, with constant or varying velocity, and with constant or varying acceleration. The directions may include any combination of horizontal, vertical, elliptical, curved, or random movement. The movement may start or stop any number of times. The magnet 104 produces a second magnetic field having a north pole 124 and south pole 128, however, the second magnetic field may have any spatial or positional relationship with respect to the first magnetic field. Magnetic sensing by the sense circuit 148 is optimized when the north-south polarity of the first magnetic field directly coincides with second magnetic field. Thus, a sensing distance d 132 is maximized when the polarities coincide. Details of the effect of polarity on magnet sensing are described in more detail in FIGS. 7A-7D.

In order for the sense circuit 148 to perform efficiently and optimally, especially with weak and/or distant magnets 104, the spatial relationship between the hall-effect sensor 112 and the radially-wound coil 108 is important. It should be understood that at all times, the separation distance s between the hall-effect sensor 112 and the radially-wound coil 108 is fixed, the polarities of both are always completely aligned, and the orientations of both to each other does not change. Thus, there is always a fixed spatial relationship between the hall-effect sensor 112 and the radially-wound coil 108.

First, the hall-effect sensor 112 and the radially-wound coil 108 are constrained to be separated by no more than a separation distance s 148. Although there is no minimum practical separation distance s 148 (ideally, the hall-effect sensor 112 and the radially-wound coil 108 are in direct contact, or touching), increasing the separation distance s 148 means that a higher level of DC current 140 will be required in order to bias the hall-effect sensor 112 to the desired bias level. In some embodiments, the hall-effect sensor 112 and the radially-wound coil 108 are separated by no more than 1 centimeter.

Second, magnetic pole positioning (polarity) of the hall-effect sensor 112 and the radially-wound coil 108 are always aligned and coincident. Therefore, the north pole 124 orientation of both should always coincide, and therefore the south pole 128 orientation of both (since directly opposite to the north pole 124 orientation) should also always coincide.

Third, the radially-wound coil 108 should be centered with respect to the hall-effect sensor 112. By centering the radially-wound coil 108 with the hall-effect sensor 112, the sense circuit 148 is horizontally symmetric and able to sense magnets 104 with equal sensitivity in all directions.

Fourth, the hall-effect sensor 112 and the radially-wound coil 108 are coaxial with each other such that the first magnetic field and sensor 112 point of maximum sensitivity are coincidental.

Figure 2:
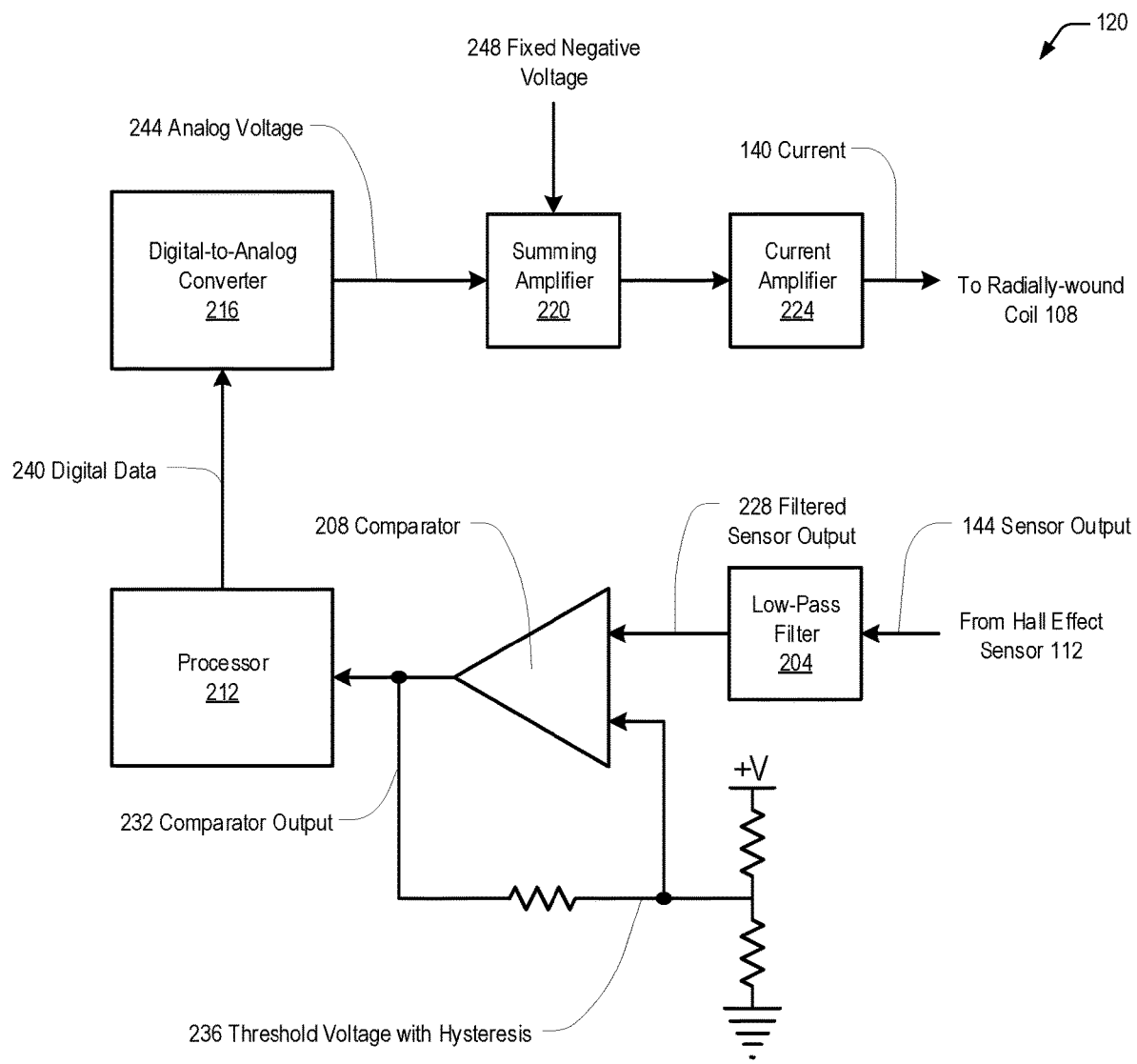
FIG. 2 is a block diagram illustrating a control circuit in accordance with a first embodiment of the present application.

The adjustable sensitivity magnet sensor 100 also includes a control circuit 120, which is described in more detail with respect to FIG. 2. The control circuit 120 receives the sensor output 144 from the hall-effect sensor 112, and provides the DC current 140 to the radially-wound coil 108.

An advantage of the present application is it is able to sense magnets accurately from only a single direction. This allows the construction of the apparatus to be simplified. Additionally, sensing apparatuses that sense from opposite sides are inherently restricted by the spacing between sensing elements and require a magnet or object to pass between the sensing elements, to some degree.

Referring now to FIG. 2, a diagram illustrating a control circuit 120 in accordance with a first embodiment of the present application is shown. The control circuit 120 receives a sensor output 144 from the hall-effect sensor 112, and provides a DC current 140 to the radially-wound coil 108.

The sensor output 144 is a generally "noisy" signal that indicates the hall-effect sensor 112 is currently detecting a magnet 104. It is advantageous to clean up the signal in order that it may be accurately interpreted. In one embodiment, a low-pass filter 204 provides a filtered sensor output 228 to a comparator 208, which provides a clean comparator output 232 to be used by a processor 212. The comparator 208 compares the filtered sensor output 228 to a threshold voltage with hysteresis 236—which is a fed back form of the comparator output 232. The threshold voltage with hysteresis 236 utilizes voltage divider and feedback resistors to condition the comparator output 232 to levels optimized for the comparator 208. No specific values are shown since that is implementation-dependent and depends on the comparator 208 device used, characteristics of the filtered sensor output 228, and signaling requirements for the processor 212. Although the embodiment illustrated uses hardware low-pass filter 204 and comparator 208 components, it should be understand that many other forms of signal conditioning may be equivalently used without deviating from the scope of the present application—including digital signal processing and software-based signal conditioning by the processor 212 or another device.

The processor 212 represents a central processing unit (CPU) and associated memory resources to interpret the comparator output 232, and in some embodiments provide control data 240 for the DC current 140 that directly corresponds to the comparator output 232.

The processor 212 executes an operating system and one or more software applications, which are generally stored in the memory resources. The processor 212 may include any type of processor known in the art, including embedded CPUs, RISC CPUs, Intel or Apple-compatible CPUs, and may include any combination of hardware and software. Processor 212 may include several devices including field-programmable gate arrays (FPGAs), memory controllers, North Bridge devices, and/or South Bridge devices. Although in most embodiments, processor 212 fetches application program instructions and metadata from the memory resources, it should be understood that processor 212 and applications may be configured in any allowable hardware/software configuration, including pure hardware configurations implemented in ASIC or FPGA forms.

The memory resources may include one or both of volatile and nonvolatile memory types. In some embodiments, the memory resources include firmware which includes program instructions that processor 212 fetches and executes, including program instructions for the processes disclosed herein. Examples of non-volatile memory may include, but are not limited to, flash memory, SD, Erasable Programmable Read Only Memory (EPROM), Electrically Erasable Programmable Read Only Memory (EEPROM), hard disks, and Non-Volatile Read-Only Memory (NOVRAM). Volatile memory stores various data structures and user data. Examples of volatile memory may include, but are not limited to, Static Random Access Memory (SRAM), Dual Data Rate Random Access Memory (DDR RAM), Dual Data Rate 2 Random Access Memory (DDR2 RAM), Dual Data Rate 3 Random Access Memory (DDR3 RAM), Zero Capacitor Random Access Memory (Z-RAM), Twin-Transistor Random Access Memory (TTRAM), Asynchronous Random Access Memory (A-RAM), ETA Random Access Memory (ETA RAM), and other forms of temporary memory. The memory resources may store any combination of metadata and one or more applications. Metadata may include various data structures in support of the operating system and software applications.

The processor 212 provides digital data 240 to a digital-to-analog converter (DAC) 216, which converts the digital data 240 into an analog voltage 244. A summing amplifier 220 receives the analog voltage 244 and adds to it a fixed negative voltage 248 (which reflects the bias level for the hall-effect sensor 112). The summing amplifier output drives a DC current amplifier 224, which provides the DC current 140 to the radially-wound coil 108. Like the filtering circuits 204, 208, it should be understood there are many different and equivalent circuits for converting the digital data 240 from the processor 212 into the DC current 140 to the radially-wound coil 108. Use of such equivalent circuits may be used in lieu of the circuits shown without deviating from the scope of the present application.

Figure 3:
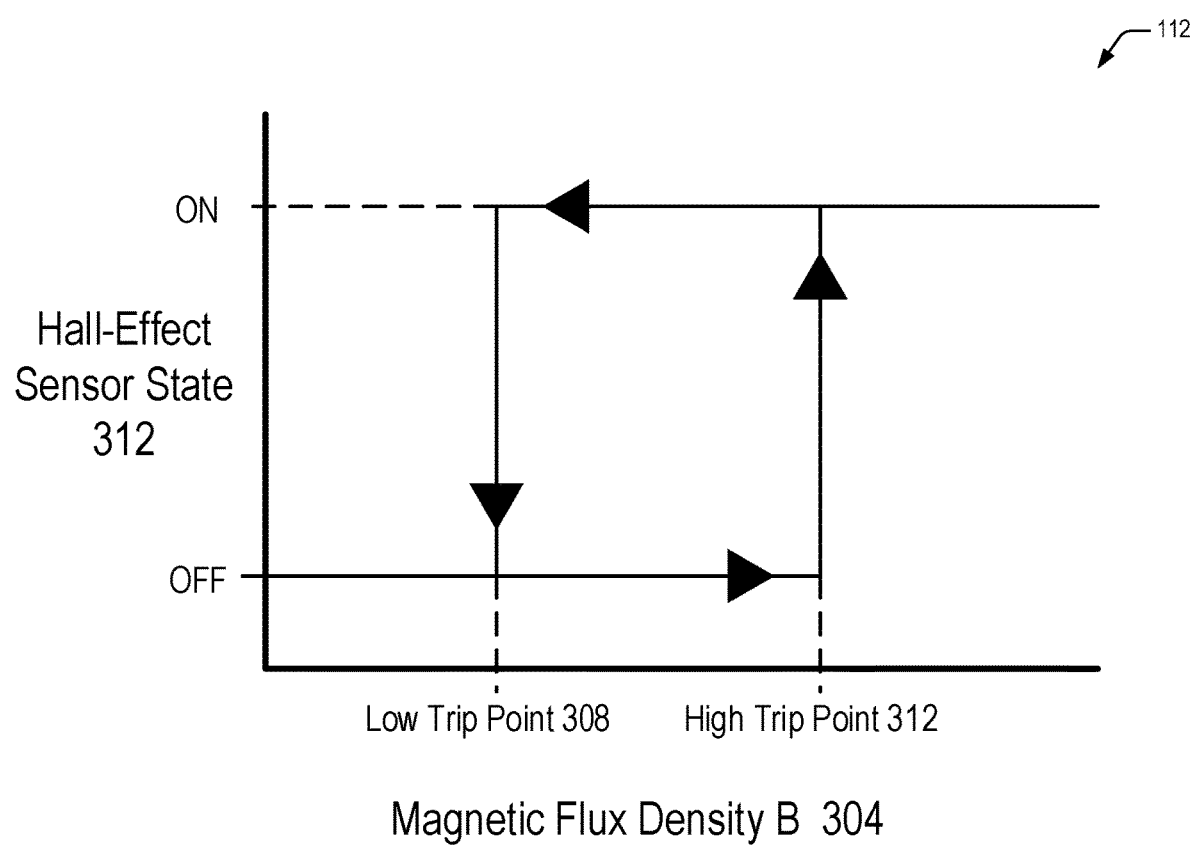
FIG. 3 is a diagram illustrating conventional hall-effect sensor hysteresis behavior in accordance with embodiments of the present application.

Referring now to FIG. 3, a diagram illustrating conventional hall-effect sensor hysteresis behavior in accordance with embodiments of the present application is shown. FIG. 3 illustrates a conventional hall-effect sensor state 312 as a function of magnetic flux density B 304 at the hall-effect sensor 112, when the hall-effect sensor 112 is powered by a conventional steady DC power source.

Hall-effect sensors 112 typically include a Schmitt trigger with built-in hysteresis connected to an internal op-amp. When a magnetic flux passing through the Hall-effect sensor 112 exceeds a pre-set value (high trip point 312) the state 312 switches quickly between its "OFF" state to an "ON" state without any type of contact bounce. This built-in hysteresis eliminates any oscillation of the output signal 144 as the sensor moves in and out of the magnetic field. Similarly, when a magnetic flux passing through the Hall-effect sensor 112 falls below a pre-set value (low trip point 308) the state 312 switches quickly between its "ON" state to an "OFF" state.

However, for the present application the built-in hysteresis of conventional hall-effect sensors 112 presents a problem. For example, a hall-effect sensor 112 may trip in the presence of a field-strength of 5.5 milliTeslas (high trip point 312), and not release again until the field-strength drops below 5.0 milliTeslas (low trip point 308). This presents a practical problem because typically, the desire is to bias this example-sensor up into some region between 5.0 and 5.5 milliTeslas in order to achieve the desired increase in sensitivity. In this case, the hall-effect sensor 112 would trip—but would never release (i.e., to an OFF hall-effect sensor state 312) because it would have been biased up to a field-strength higher than its release (i.e., high trip point 312). A means of having the hall-effect sensor state 312 release precisely when the permanent magnet 104 leaves the sensing area is needed.

Review of typical hall-effect proximity sensors reveals both an open-drain architecture as well as extremely high activation speeds: typically in the tens of microseconds. In order to address the hall-effect sensor 112 latch-up problem due to hysteresis, the present application turns the hall-effect sensor 112 on and off "very rapidly". In this case, two things occur: as the permanent magnet 104 ingresses into the field of the radially-wound coil 108, the hall-effect sensor 112 trips—first, at its threshold level and again & again while the field strength continues to grow. (i.e., while the magnet 104 continues ingressing). When the permanent magnet 104 egresses from the field of the radially-wound coil 108, the hall-effect sensor 112 releases when it can no longer "turn on"—because the sympathetic permanent magnet 104 has been removed from the sensing area. In other applications, hall-effect sensors may latch-up if the magnetic coil is biased until it produces a field strength higher that the release-point of the hall effect sensor. It is only in this case that any magnet leaving the region would not result in a release, because of the bias current in the magnetic coil. This additionally produces another beneficial effect: the turn-on and turn-off sensitivities of the hall-effect sensor 112 are identical, thus eliminating the asymmetrical (hysteresis) nature of the conventional hall-effect sensor operation.

In order to turn the hall-effect sensor 112 on & off (at a rate of tens of microseconds), a square-wave oscillator is employed—acting as power source 116. When power is removed from the hall-effect sensor 112, the hall-effect sensor 112 cannot activate and the output of the circuit pulls up to the supply voltage rail. In the preferred embodiment, the power source 116 provides power at approximately a 4 Kilohertz (KHz) frequency.

When power 116 is applied to the hall-effect sensor 112 there are two possibilities. If there is a (sympathetically aligned) permanent magnet 104 in close proximity to the hall-effect sensor 112, the hall-effect sensor 112 activates—whereas if the (sympathetically-aligned) permanent magnet 104 is outside of the hall-effect sensor 112 field, then the hall-effect sensor 112 does not activate. Decoupling capacitance is needed in order to produce smooth operation of the hall-effect sensor 112 while its power supply 116 voltage is applied and removed rapidly.

Advantageously, this combination of power source 116 and hall-effect sensor 112 allows a very small magnet 104 to trip the hall-effect sensor 112 and for the hall-effect sensor 112 to be able to release (when the magnet 104 leaves the sensing area) far above the hall-effect sensor's 112 normal hysteresis level. This operates the hall-effect sensor 112 (on AND off) far above the usual turn-off level. This key feature is what permits detection of tiny magnets 104 at large distances.

Therefore, an advantage of the present application is that it alleviates hysteresis disadvantages of conventional hall-effect sensors when powered by conventional steady DC power sources. Because of hysteresis, conventional hall-effect sensors remain in a "latch up" or activated output condition long after a magnet has left a sensing area. Hall-effect sensors may latch-up if the magnetic coil is biased until it produces a field strength higher that the release-point of the hall effect sensor. It is only in this case that any magnet leaving the region would not result in a release, because of the bias current in the magnetic coil. This may result in inaccurate magnet detection and provide misleading information with respect to timing. The present application utilizes a varying power source that prevents a hall-effect sensor from remaining in a "latch up" condition due to internal hysteresis.

Figure 4A:
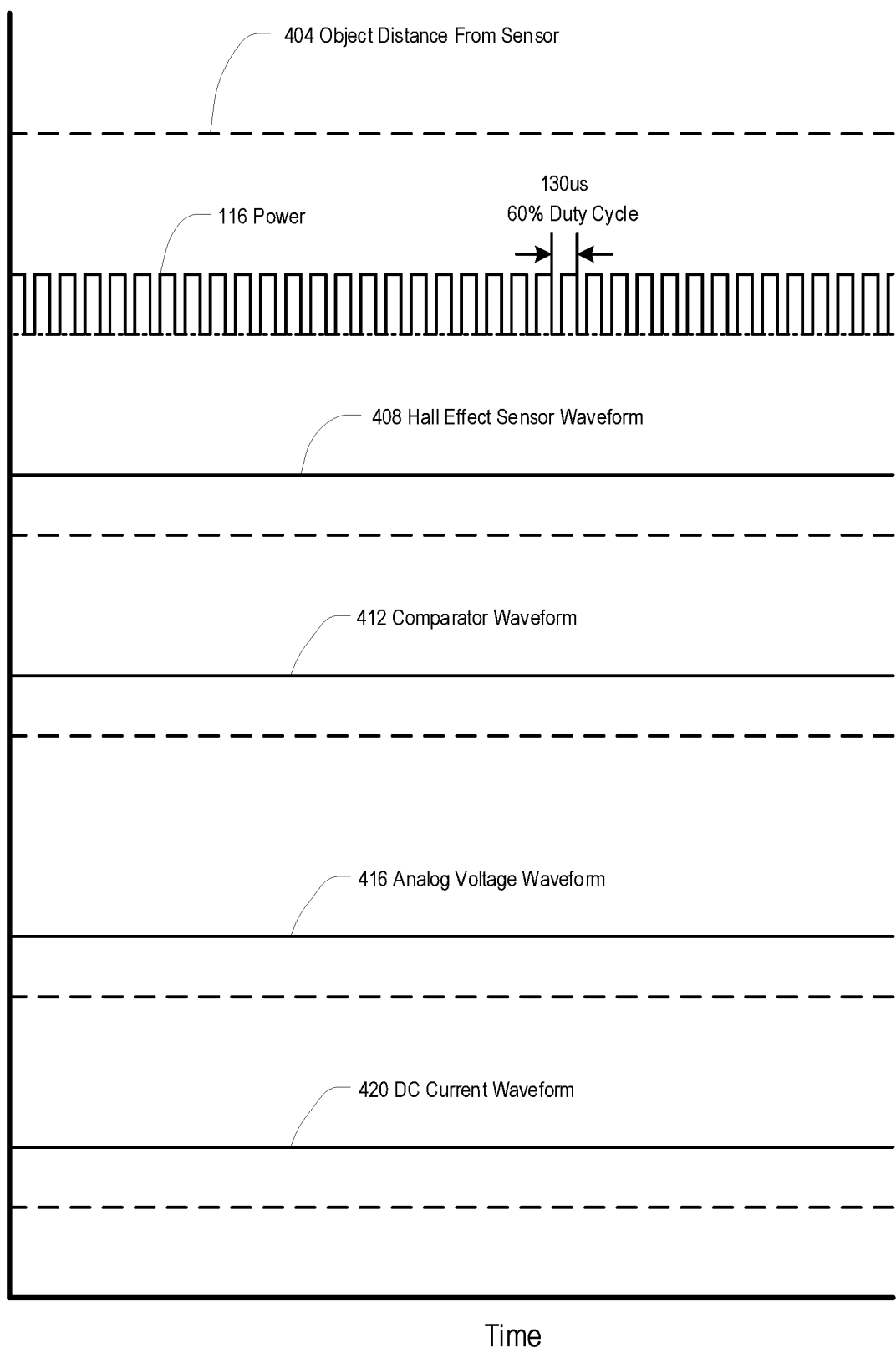
FIG. 4A is a diagram illustrating unipolar signal propagation when no object is detected, in accordance with embodiments of the present application.

Referring now to FIG. 4A, a diagram illustrating unipolar signal propagation when no object is detected in accordance with embodiments of the present application is shown. FIG. 4A illustrates a case where no magnet 104 or object is detected by the sense circuit 148, in order to provide a corresponding description for other critical signals under those conditions.

The device may be configured to operate with either unipolar sensing or omnipolar sensing. Unipolar sensing is magnet sensing using only a single magnetic polarity at all times. This means that the first magnetic field produced by the radially-wound coil 108 has a defined north orientation that does not change. Although a unipolar arrangement is potentially simpler and less expensive than other configurations (omnipolar, for example), it has a major disadvantage. It may be less effective for sensing magnets 104 having a second magnetic field with a different or opposite polarity as the first magnetic field. However, if one understands that all magnets 104 (or at least magnets 104 that one was concerned about) had the same or a similar polarity as the first magnetic field, then the unipolar configuration would likely be simpler and less complex than other alternatives.

The top waveform illustrates no object (magnet 104) within a detection distance 404 from the hall-effect sensor 112. The power 116 provides a modulated power input to the hall-effect sensor 112 that provides power according to a fixed frequency and duty cycle. In the preferred embodiment, the power 116 has a 130 microsecond period (7.692 KHz) with a 60% duty cycle. This corresponds to an "on time" of 78 microseconds alternated with an "off time" of 52 microseconds. Thus, the hall-effect sensor 112 is pulsed with a power input between on and off states 312. The hall-effect sensor 112 only operates when it is receiving power 116. Advantageously, pulsing the power significantly reduces both power consumption and heat generation while not inhibiting magnet 104 detection. Even magnets 104 moving at relatively high velocities may be detected by pulsing power 116 to the hall-effect sensor 112 at a high rate. However, in spite of the advantages associated with pulsing power 116 to the hall-effect sensor 112, the present application includes embodiments where either the power 116 may be constant and not pulsed, or pulsed at a different rate than specifically described.

The hall-effect sensor waveform 408 and the comparator waveform 412 do not provide an indication of detecting the magnet 104, since a magnet 104 is not present. Because the device is configured with unipolar sensing, the analog voltage waveform 416 and the DC current waveform 420 are steady and unchanging.

Another advantage of the present application is it provides a simplified apparatus and construction for sensing magnets with a known and repeatable orientation. By using a unipolar sensor configuration, such magnets may be reliably detected while simplifying operation of the control circuit.

Figure 4B:
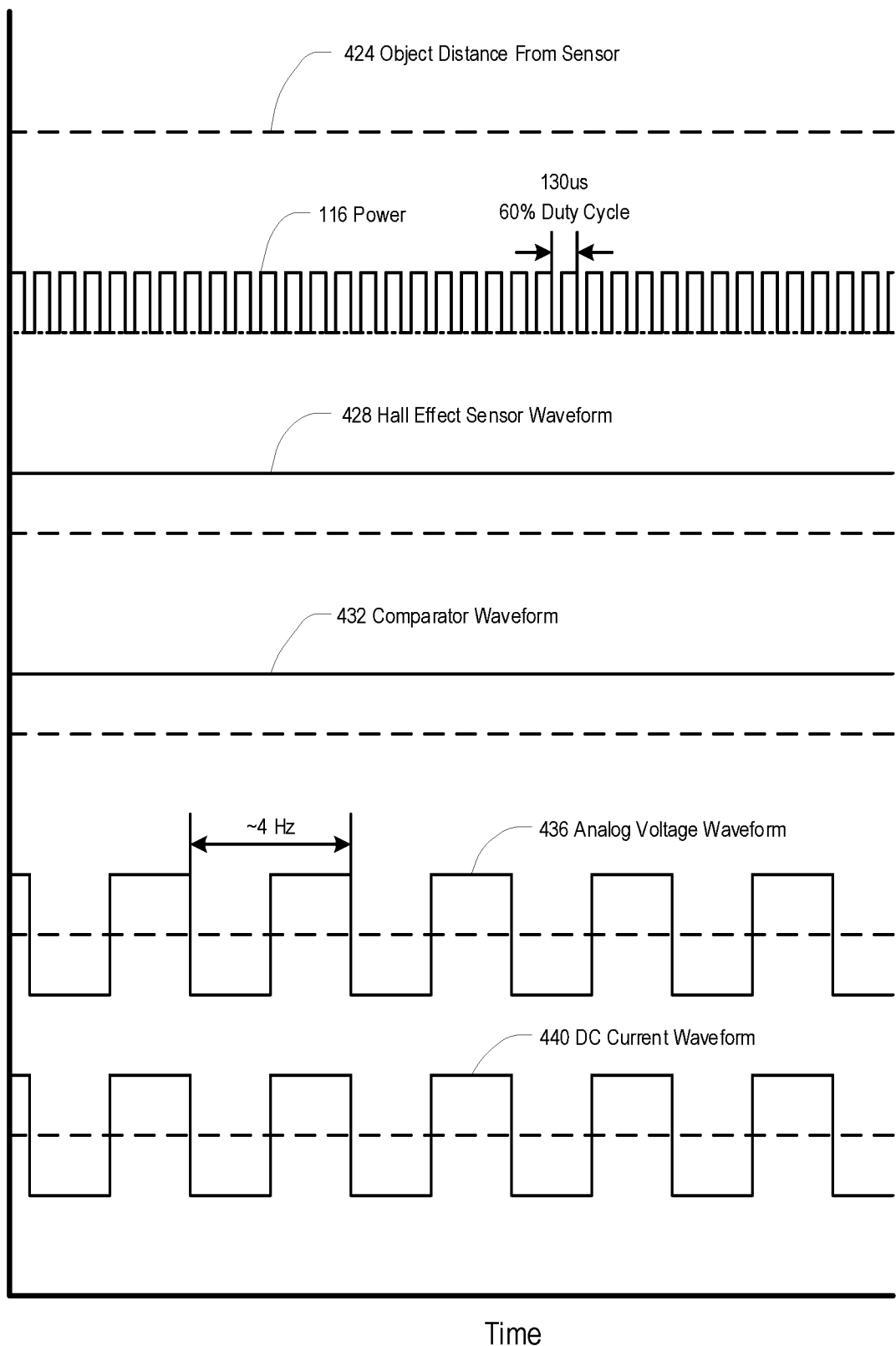
FIG. 4B is a diagram illustrating omnipolar signal propagation when no object is detected, in accordance with embodiments of the present application.

Referring now to FIG. 4B, a diagram illustrating omnipolar signal propagation when no object is detected in accordance with embodiments of the present application is shown. FIG. 4B illustrates a case where no magnet 104 or object is detected by the sense circuit 148, in order to provide a corresponding description for other critical signals under those conditions.

Omnipolar sensing is magnet sensing using a dual magnetic polarity. This means that the first magnetic field produced by the radially-wound coil 108 has an alternating north and south orientation. Omnipolar sensing requires an alternating DC current 140 to the radially-wound coil 108.

The top waveform illustrates no object (magnet 104) within a detection distance 424 from the hall-effect sensor 112. The power source 116 provides a modulated power input to the hall-effect sensor 112, as described with reference to FIG. 4A.

The hall-effect sensor waveform 428 and the comparator waveform 432 do not provide an indication of detecting the magnet 104. Because the device is configured with omnipolar sensing, the analog voltage waveform 436 and the DC current waveform 440 are alternating waveforms when a magnet 104 is not detected.

The analog voltage waveform 436 and the DC current waveform 440 alternate between a positive and a negative value in order to reverse the first magnetic field from the radially-wound coil 108. This has a major advantage when the polarity of the magnet 104 is unknown, unpredictable, or likely to change. The effect of this is described in more detail with respect to FIGS. 7A-7D. The rate of change for the analog voltage waveform 436 and the DC current waveform 440 in the preferred embodiment is approximately 4 Hz. However, in other embodiments it may be greater than or less than 4 Hz, as long as magnets 104 move at a velocity that allows for reliable detection.

An advantage of the present application is it provides an ability to detect magnets either having any conceivable orientation/polarity. When a sensing circuit is configured in an omnipolar configuration, a magnetic field with alternating polarity is produced. The magnetic field alternates between first and second (opposite to first) polarity and provides the greatest sensing sensitivity when a sympathetic field to the magnet is produced.

Figure 5A:
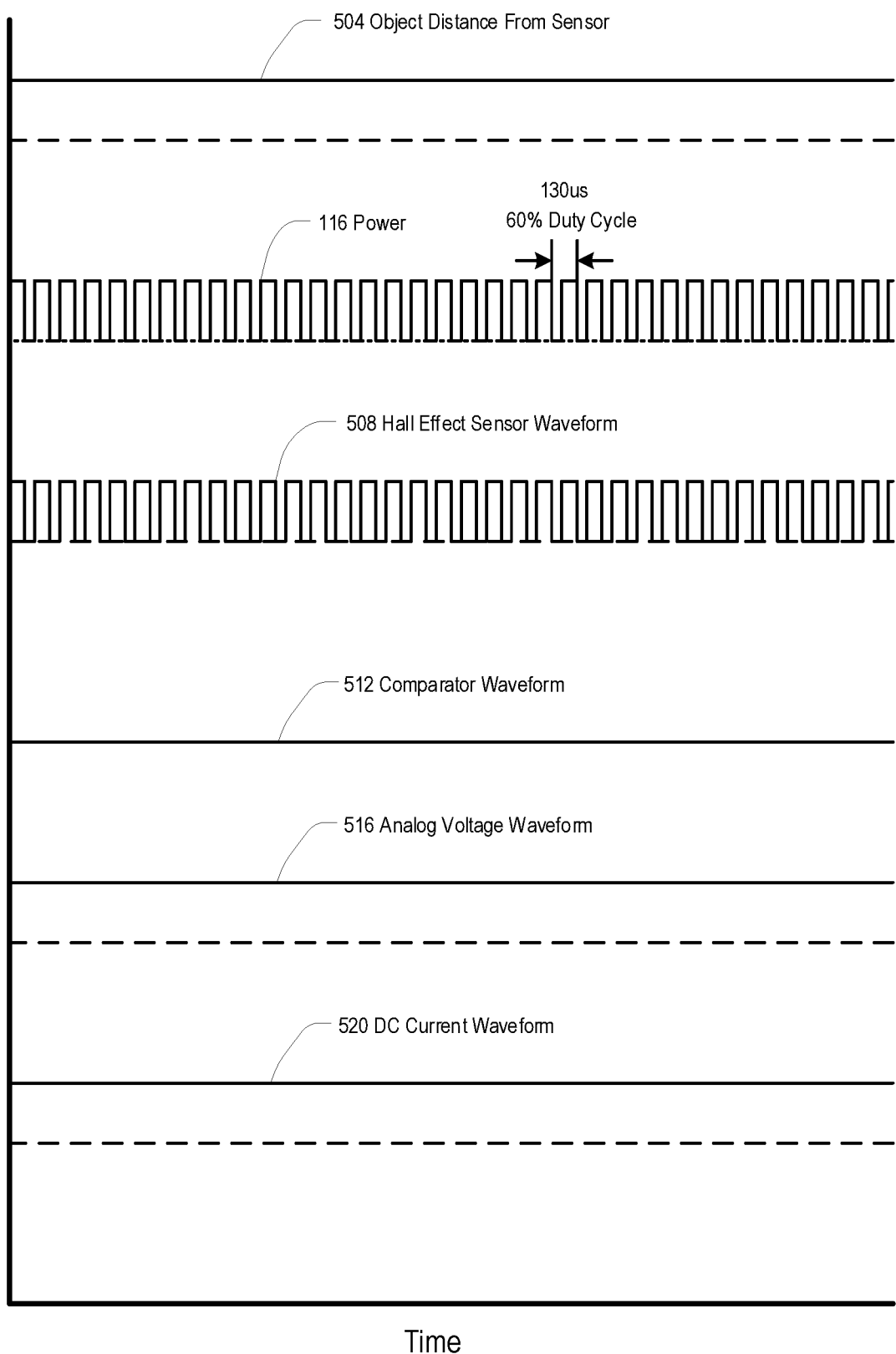
FIG. 5A is a diagram illustrating unipolar signal propagation when an object is at a fixed detected distance, in accordance with embodiments of the present application.

Referring now to FIG. 5A, a diagram illustrating unipolar signal propagation when an object is detected at a fixed distance d in accordance with embodiments of the present application is shown. FIG. 5A illustrates a case where a magnet 104 or object is detected by the sense circuit 148, in order to provide a corresponding description for other critical signals under those conditions.

The top waveform illustrates an object (magnet 104) at a fixed detection distance 504 from the hall-effect sensor 112. The power source 116 provides a modulated power input to the hall-effect sensor 112, as described with reference to FIG. 4A.

The hall-effect sensor waveform 508 and the comparator waveform 512 each provide an indication of detecting the magnet 104. In the example shown, the comparator waveform 512 is an active-low signal and therefore remains in the "low" state while the magnet 104 is being detected. Because the device is configured with unipolar sensing, the analog voltage waveform 516 and the DC current waveform 520 are steady and unchanging.

Figure 5B:
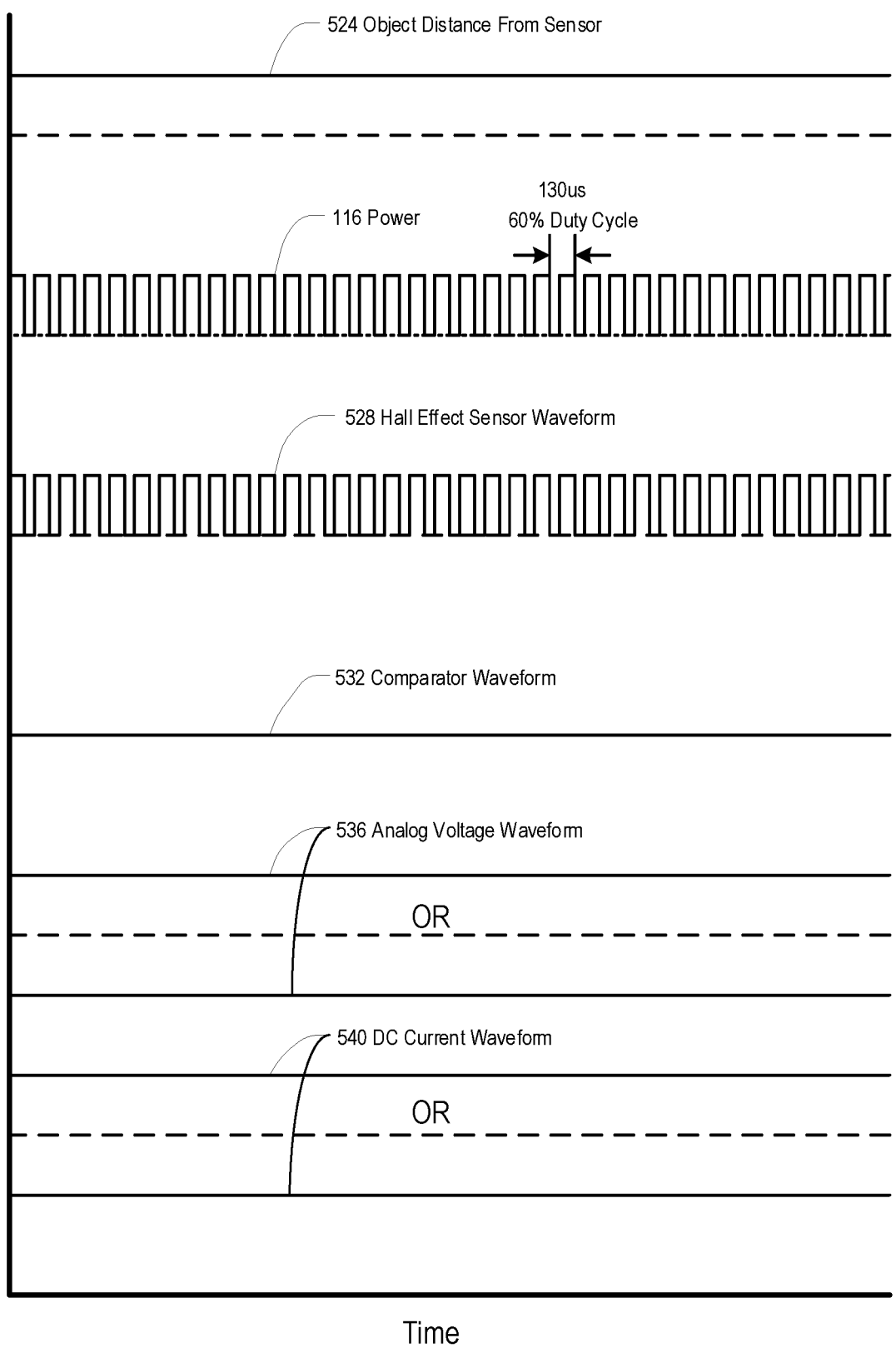
FIG. 5B is a diagram illustrating omnipolar signal propagation when an object is at a fixed detected distance, in accordance with embodiments of the present application.

Referring now to FIG. 5B, a diagram illustrating omnipolar signal propagation when an object is detected at a fixed distance d in accordance with embodiments of the present application is shown. FIG. 5B illustrates a case where a magnet 104 or object is detected by the sense circuit 148, in order to provide a corresponding description for other critical signals under those conditions.

The top waveform illustrates an object (magnet 104) at a fixed detection distance 524 from the hall-effect sensor 112. The power source 116 provides a modulated power input to the hall-effect sensor 112, as described with reference to FIG. 4A.

Figure 7A:
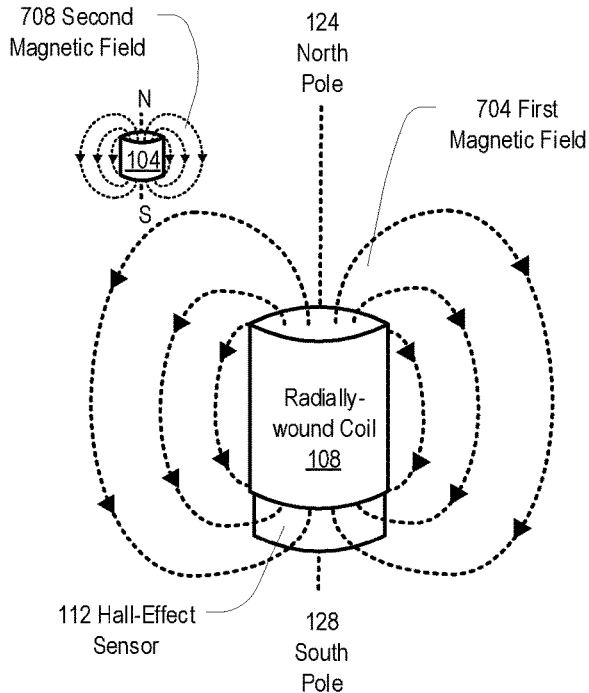
FIG. 7A is a diagram illustrating magnetic object detection in fully sympathetic magnetic fields, in accordance with embodiments of the present application.
Figure 7A:
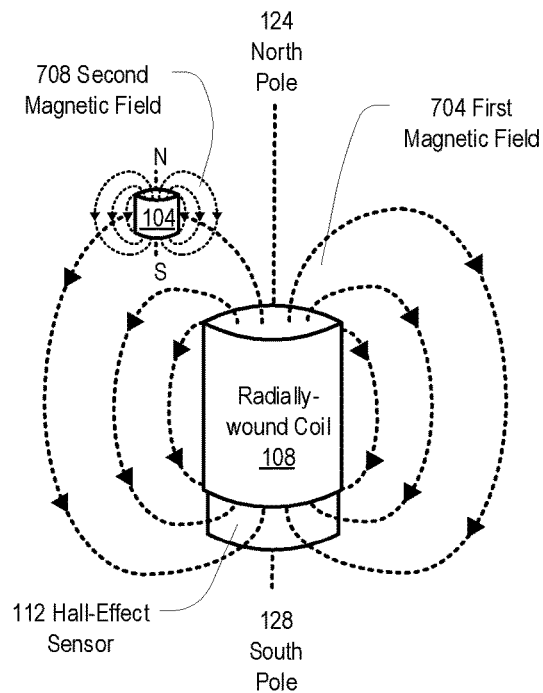
Figure 7A:
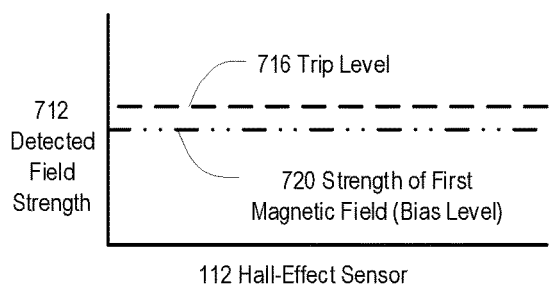
Figure 7A:
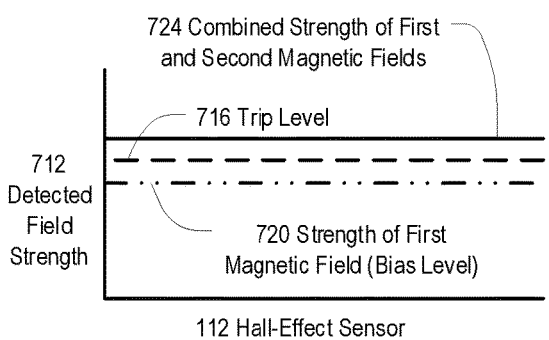

The hall-effect sensor waveform 528 and the comparator waveform 532 each provide an indication of detecting the magnet 104. Because the device is configured with omnipolar sensing, the analog voltage waveform 536 and the DC current waveform 540 are constant and unchanging waveforms when a magnet 104 is detected. However, the analog voltage waveform 536 and the DC current waveform 540 are both either positive or negative while the magnet 104 is detected. The reason for that has to do with sympathetic polarities between the first and second magnetic fields. Referring to FIGS. 7A and 7D, sympathetic magnetic fields are required in order to detect a magnet 104 since the second magnetic field 708 produced by the magnet 104 must add enough to the bias level for the first magnetic field 704 to exceed the trip level 716 for the hall-effect sensor 112. Once a magnet 104 is initially detected (this occurs prior to the waveforms in FIG. 5B), the first magnetic field 704 polarity should not change until the magnet 104 is no longer detected—since changing it will result in the bias level 720 changing and the magnet 104 will no longer be detected. Thus, if the DC current 140 was "positive" when the magnet 104 was initially detected, it needs to remain "positive" in order for the second magnetic field 708 to add enough to the bias level 720 to cause the trip level 716 to be exceeded. Similarly, if the DC current 140 was "negative" when the magnet 104 was initially detected, it needs to remain "negative" in order for the second magnetic field 708 to add enough to the bias level 720 to cause the trip level 716 to be exceeded.

Figure 6A:
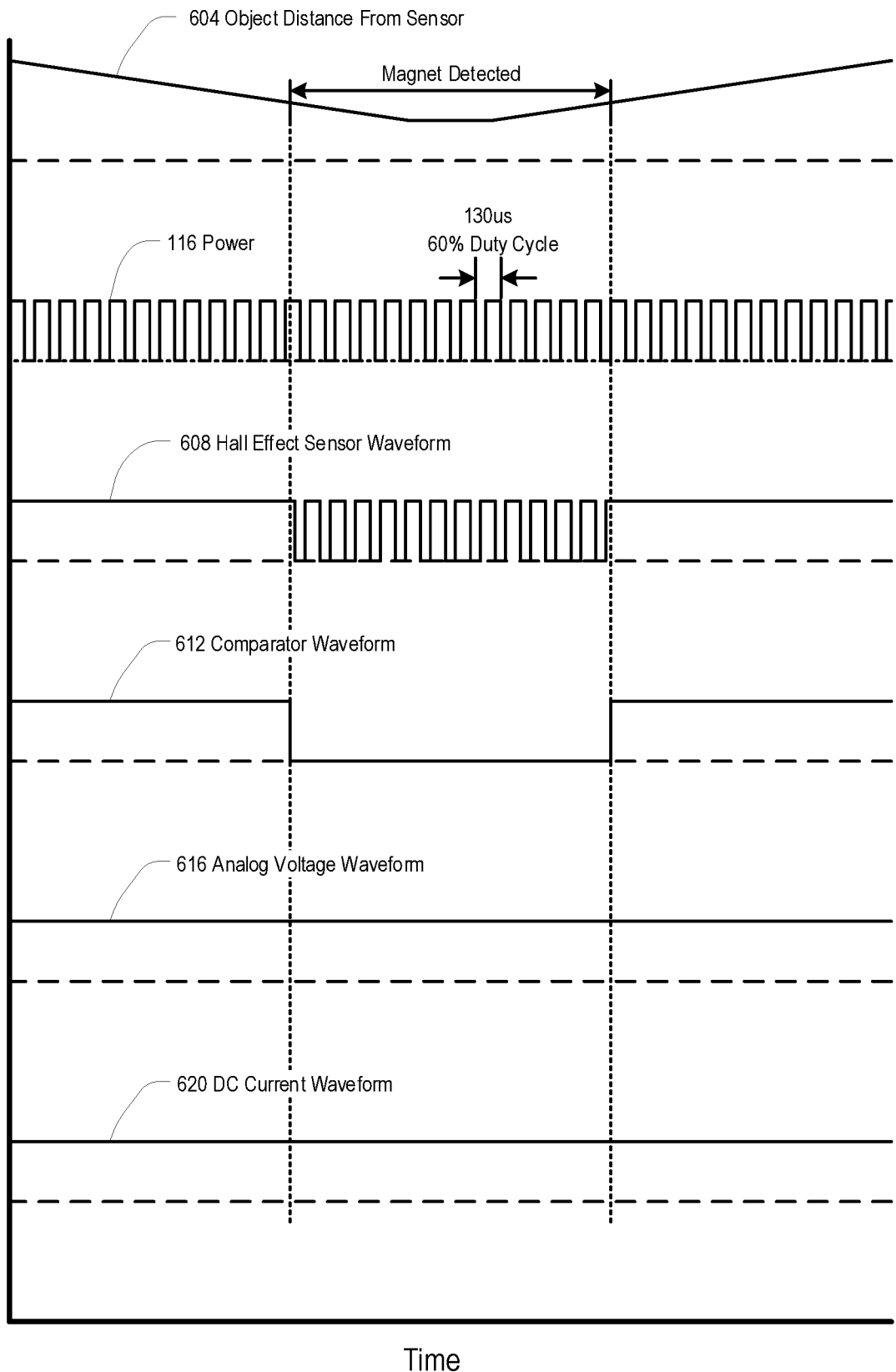
FIG. 6A is a diagram illustrating unipolar signal propagation when an object is moving toward a sensor, then away, in accordance with embodiments of the present application.

Referring now to FIG. 6A, a diagram illustrating unipolar signal propagation when an object is moving toward a sensor then away in accordance with embodiments of the present application is shown. FIG. 6A illustrates a case where a magnet 104 or object is initially detected by the sense circuit 148, then moves out of detection, in order to provide a corresponding description for other critical signals under those conditions.

The top waveform illustrates an object (magnet 104) at a variable detection distance 604 from the hall-effect sensor 112. The magnet 104 initially is at a greater distance than distance 604 from the hall-effect sensor 112, and the hall-effect sensor 112 does not detect the magnet 104. As the magnet 104 moves closer to the hall-effect sensor 112, the magnet 104 may be detected at some point. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, the magnet 104 moves beyond a distance d 132 and is no longer detected. The power source 116 provides a modulated power input to the hall-effect sensor 112, as described with reference to FIG. 4A.

The hall-effect sensor waveform 608 and the comparator waveform 612 each provide a negative indication of detecting the magnet 104 both before the magnet 104 is detected and after the magnet 104 is no longer detected. However, while the magnet 104 is detected, the hall-effect sensor output 144 indicates a modulated waveform 608 with similar characteristics to the power source 116. Because of the low-pass filter 204 and the comparator 208, the waveform is "cleaned up" so that a clean comparator waveform 612 is produced to the processor 212. Because this is a unipolar sensing case, the analog voltage waveform 616 and the DC current waveform 620 are steady and unchanging.

Figure 6B:
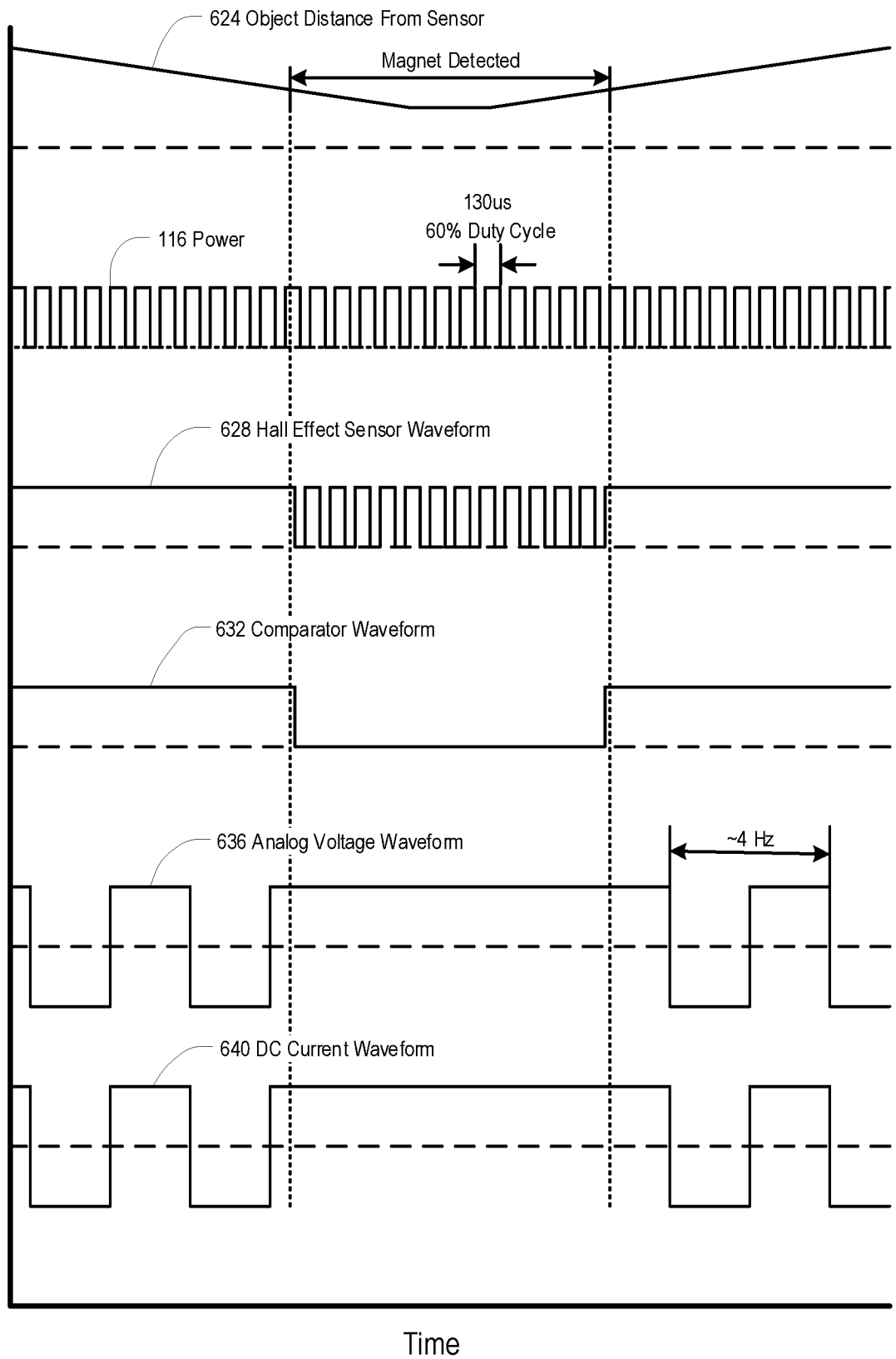
FIG. 6B is a diagram illustrating omnipolar signal propagation when an object is moving toward a sensor, then away, in accordance with a first embodiment of the present application.

Referring now to FIG. 6B, a diagram illustrating omnipolar signal propagation when an object is moving toward a sensor then away in accordance with embodiments of the present application is shown. FIG. 6B illustrates a case where a magnet 104 or object is initially detected by the sense circuit 148, then moves out of detection, in order to provide a corresponding description for other critical signals under those conditions.

The top waveform illustrates an object (magnet 104) at a variable detection distance 624 from the hall-effect sensor 112. The magnet 104 initially is at a greater distance than distance d 132 from the hall-effect sensor 112, and the hall-effect sensor 112 does not detect the magnet 104. As the magnet 104 moves closer to the hall-effect sensor 112, the magnet 104 is detected. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, the magnet 104 moves beyond distance d 132 and is no longer detected. The power source 116 provides a modulated power input to the hall-effect sensor 112, as described with reference to FIG. 4A.

The hall-effect sensor waveform 628 and the comparator waveform 632 each provide a negative indication of detecting the magnet 104 both before the magnet 104 is detected and after the magnet 104 is no longer detected. However, while the magnet 104 is detected, the hall-effect sensor waveform 628 indicates a modulated waveform with similar characteristics to the power source 116. Because of the low-pass filter 204 and the comparator 208, the waveform is "cleaned up" so that a clean comparator waveform 632 is produced to the processor 212.

The analog voltage waveform 636 and the DC current waveform 640 are each alternating waveforms when the magnet 104 is not detected, as described with reference to FIG. 4B. At the time the magnet 104 is first detected, both the analog voltage waveform 636 and the DC current waveform 640 happen to have positive values. As described with reference to FIG. 5B, whatever positive (or negative) value the analog voltage waveform 636 and the DC current waveform 640 have when the magnet 104 is first detected is maintained while the hall-effect sensor 112 still detects the magnet 104. This is because only sympathetic first (radially-wound coil 108) and second (magnet 104) magnetic fields are able to exceed the trip level 716 for the hall-effect sensor 112.

Figure 6C:
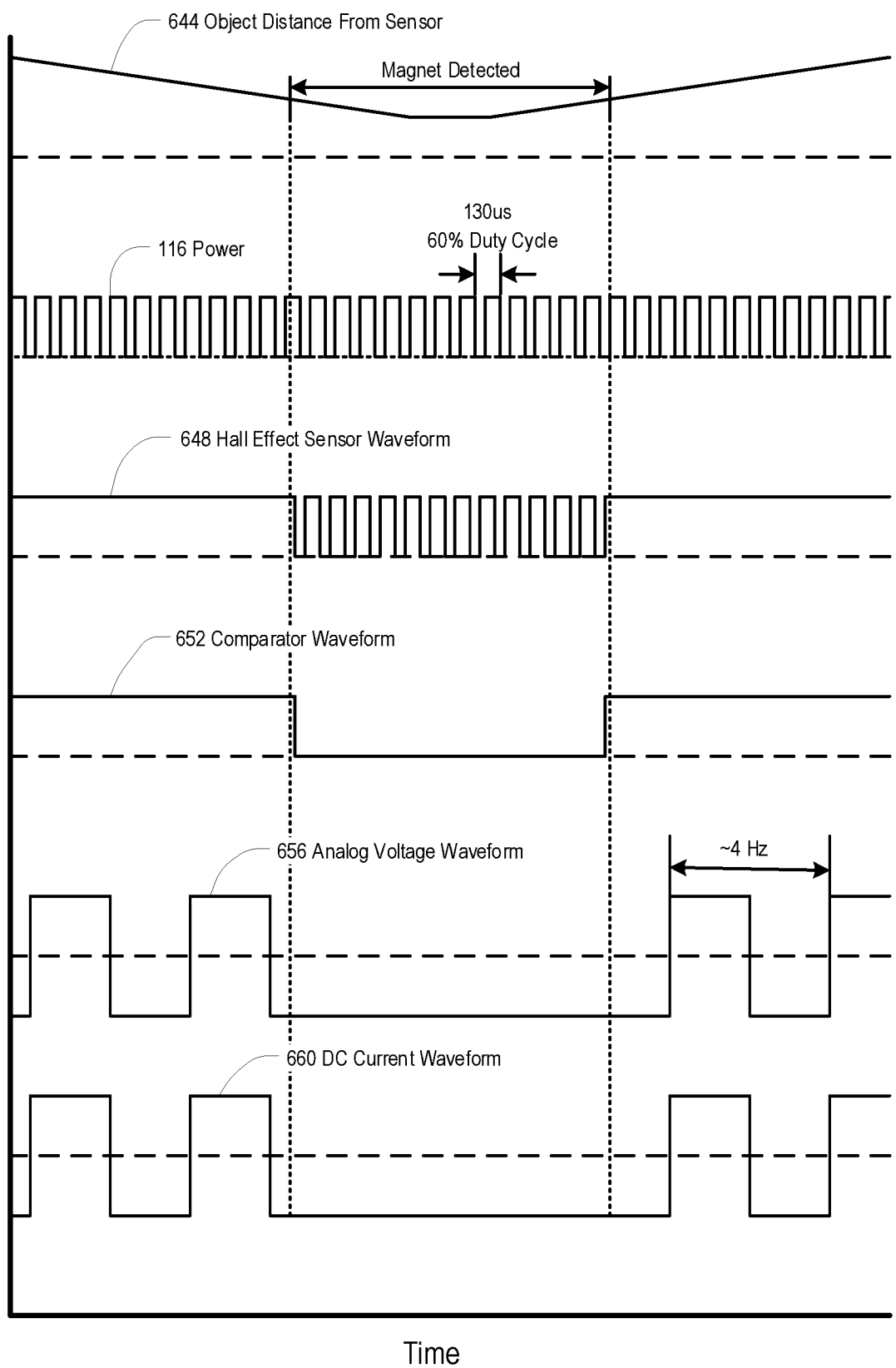
FIG. 6C is a diagram illustrating omnipolar signal propagation when an object is moving toward a sensor, then away, in accordance with a second embodiment of the present application.

Referring now to FIG. 6C, a diagram illustrating omnipolar signal propagation when an object is moving toward a sensor then away in accordance with embodiments of the present application is shown. FIG. 6C illustrates a case where a magnet 104 or object is initially detected by the sense circuit 148, then moves out of detection, in order to provide a corresponding description for other critical signals under those conditions. FIG. 6C is identical to FIG. 6B but reflects a case where, at the time the magnet 104 is first detected, both the analog voltage waveform 656 and DC current waveform 660 happen to have negative (instead of positive per FIG. 6B) values. As described with reference to FIG. 5B, whatever positive (or negative) value the analog voltage waveform 656 and the DC current waveform 660 have when the magnet 104 is first detected is maintained while the hall-effect sensor 112 still detects the magnet 104. This is because only sympathetic first (radially-wound coil 108) and second (magnet 104) magnetic fields are able to exceed the trip level 716 for the hall-effect sensor 112. Therefore, both the analog voltage waveform 656 and the DC current waveform 660 maintain the "negative" values during magnet 104 detection.

Referring now to FIG. 7A, a diagram illustrating magnetic object detection in fully sympathetic magnetic fields, in accordance with embodiments of the present application is shown.

The present application describes a magnet 104 sensing technique based on a bias level 720 and a slightly higher trip level 716. The second magnetic field 708 from the magnet 104 is what causes the trip level 716 to be exceeded. FIGS. 7A-7D describe several cases where the trip level 716 is or is not exceeded, based on polar orientations of the first 704 and the second 708 magnetic fields. Although the examples illustrated in FIGS. 7A-7D only show the first magnetic field 704 when in a "positive" polarity of an omnipolar sensing configuration (corresponding to positive values of the analog voltage waveform 436 and the DC current waveform 440 in FIG. 4B), it should be understood that the first magnetic field 704 has a "negative" polarity (corresponding to negative values of the analog voltage waveform 436 and the DC current waveform 440 in FIG. 4B) approximately half the time for omnipolar configurations.

FIG. 7A illustrates a case where a magnet 104 enters a fully sympathetic magnetic field (first magnetic field 704) of the radially-wound coil 108. The illustration in FIG. 7A applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 matches the polarity of the second magnetic field 708.

The left side of FIG. 7A reflects the hall-effect sensor 112 does not detect the magnet 104. Even though the first 704 and second 708 magnetic fields are sympathetically aligned, the hall-effect sensor 112 does not detect the magnet 104 because the combination (sum) of the first magnetic field 704 and the second magnetic field 708 at the hall-effect sensor 112 does not exceed the trip level 716. This case may correspond to the magnet 104 polarity-aligned with the radially-wound coil 108 but at a distance greater than distance d 132 the hall-effect sensor can detect, or a weaker magnet 104 not able to be detected by the hall-effect sensor 112.

The diagram in the lower left of FIG. 7A corresponds with the detection case in the upper left of FIG. 7A. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected.

The right side of FIG. 7A reflects the hall-effect sensor 112 detects the magnet 104 since the magnet 104 has moved into a detection distance. Because the first 704 and second 708 magnetic fields are sympathetically aligned, the hall-effect sensor 112 detects the magnet 104 because the combination (sum) of the first magnetic field 704 and the second magnetic field 708 at the hall-effect sensor 112 exceeds the trip level 716. This case may correspond to the magnet 104 polarity-aligned with the radially-wound coil 108 and within a distance d 132 for the hall-effect sensor, or a stronger magnet 104 able to be detected by the hall-effect sensor 112.

The diagram in the lower right of FIG. 7A corresponds with the detection case in the upper right of FIG. 7A. Therefore, the detected field strength 712 (i.e. combined strength 724 of the first 704 and second 708 magnetic fields) exceeds the trip level 716 for the hall-effect sensor 112. Because the trip level 716 has been exceeded, the sensor output 144 is active—reflecting the magnet 104 is detected.

An advantage of the present application is that it provides an apparatus to accurately sense proximity of small magnets without requiring high DC current levels. A combination of a matched radially-wound coil 108 and a hall-effect sensor 112 with an adjustable control circuit 120 biases the hall-effect sensor close to the trip level 716. A relatively weak magnetic field 708 from a magnet 104 causes the trip level 716 to be exceeded and the magnet 104 to be detected.

Figure 7B:
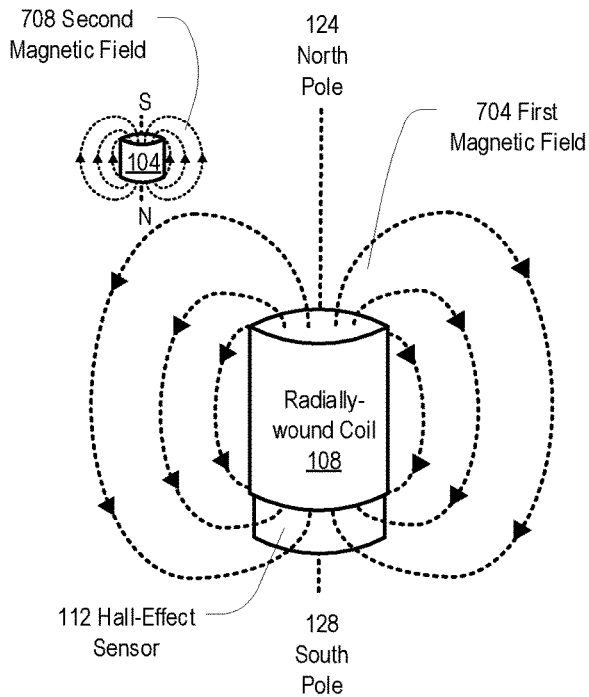
FIG. 7B is a diagram illustrating magnetic object non-detection in fully non-sympathetic magnetic fields, in accordance with embodiments of the present application.
Figure 7B:
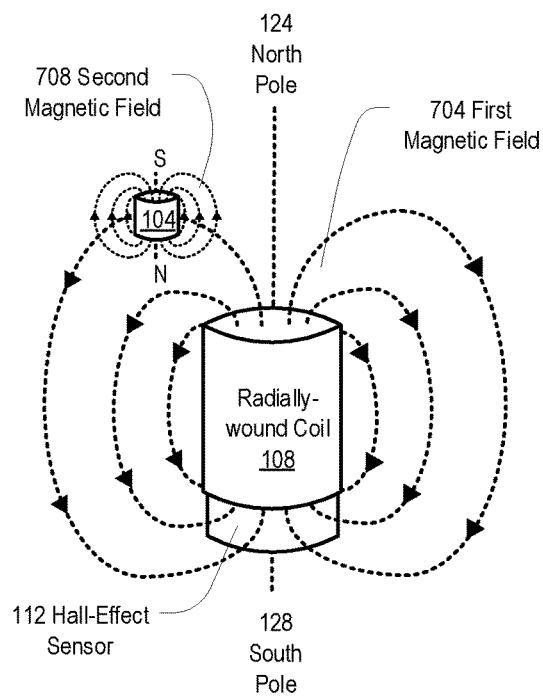
Figure 7B:
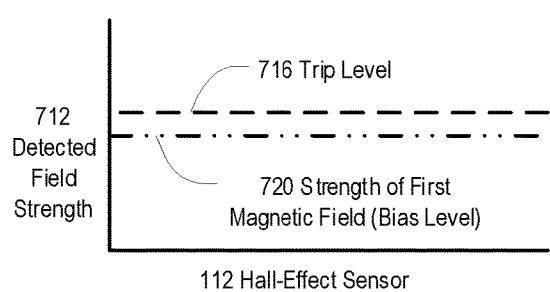
Figure 7B:
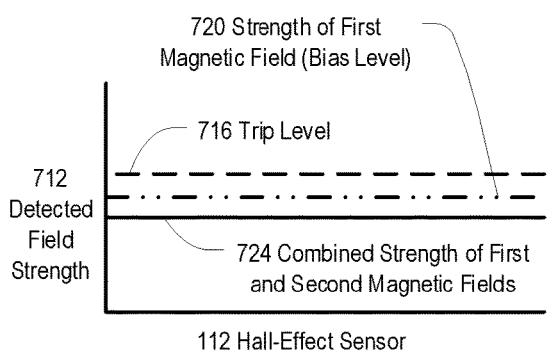

Referring now to FIG. 7B, a diagram illustrating magnetic object non-detection in fully non-sympathetic magnetic fields, in accordance with embodiments of the present application is shown. FIG. 7B illustrates a case where a magnet 104 enters a fully non-sympathetic magnetic field (first magnetic field 704) of the radially-wound coil 108. The illustration in FIG. 7B applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 is directly opposite the polarity of the second magnetic field 708.

The left side of FIG. 7B reflects the hall-effect sensor 112 does not detect the magnet 104. The first 704 and second 708 magnetic fields are non-sympathetically aligned, and the hall-effect sensor 112 does not detect the magnet 104 because the combination (sum) of the first magnetic field 704 and the second magnetic field 708 at the hall-effect sensor 112 does not exceed the trip level 716. This case may correspond to the magnet 104 polarity-opposite with the radially-wound coil 108 and at a distance greater than distance d 132 the hall-effect sensor 112 can detect.

The diagram in the lower left of FIG. 7B corresponds with the detection case in the upper left of FIG. 7B. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected. Moreover, because the polarities of the first 704 and second 708 magnetic fields are opposite, the second field strength 708 subtracts from the strength of the first magnetic field (bias level) 720, guaranteeing the hall-effect sensor 112 will not detect the magnet 104.

The right side of FIG. 7B reflects the hall-effect sensor 112 still does not detect the magnet 104, even though the magnet 104 has moved into a detection distance. Because the first 704 and second 708 magnetic fields are non-sympathetically aligned, the hall-effect sensor 112 cannot detect the magnet 104 because the combination (sum) of the first magnetic field 704 and the second magnetic field 708 at the hall-effect sensor 112 is less than the trip level 716.

The diagram in the lower right of FIG. 7B corresponds with the detection case in the upper right of FIG. 7B. Therefore, the detected field strength 712 (i.e. combined strength 724 of the first 704 and second 708 magnetic fields) is less than both the strength of the first magnetic field (bias level 720) and the trip level 716 for the hall-effect sensor 112. Because the trip level 716 has not been exceeded, the sensor output 144 is static—reflecting the magnet 104 has not been detected.

Figure 7C:
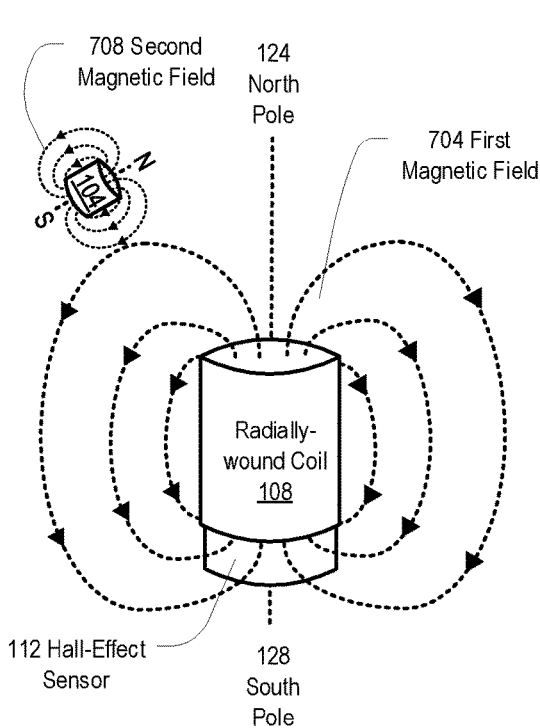
FIG. 7C is a diagram illustrating magnetic object non-detection in partially sympathetic magnetic fields, in accordance with embodiments of the present application.
Figure 7C:
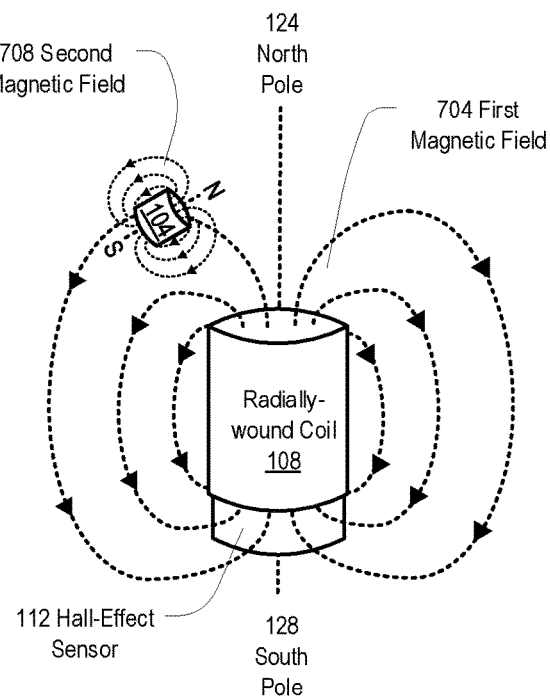
Figure 7C:
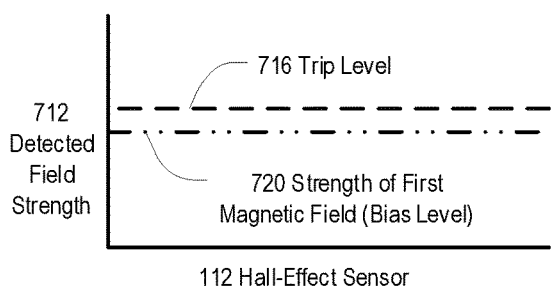
Figure 7C:
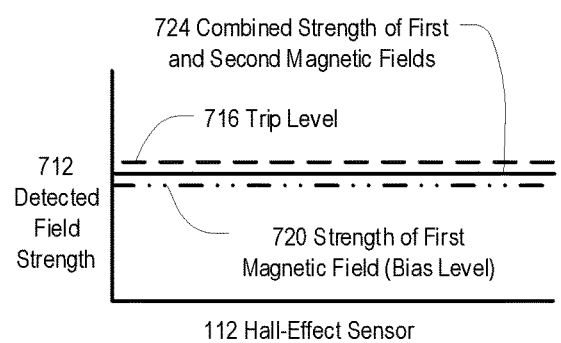
Figure 7D:
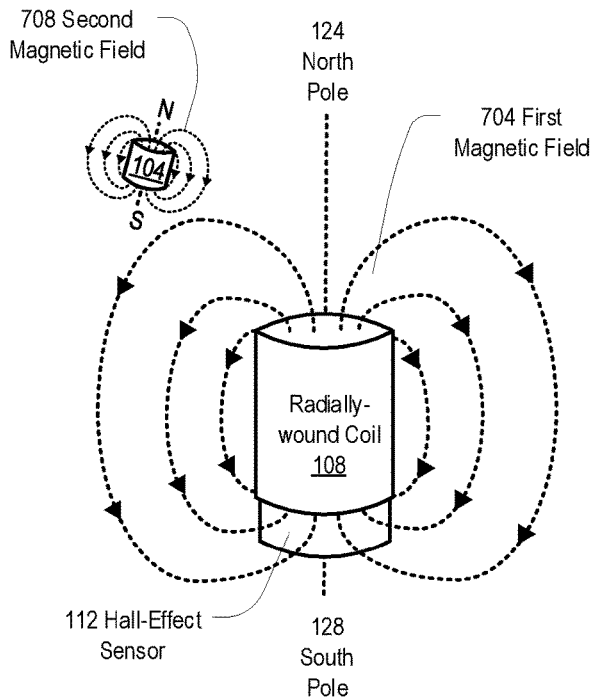
FIG. 7D is a diagram illustrating magnetic object detection in partially sympathetic magnetic fields, in accordance with embodiments of the present application.
Figure 7D:
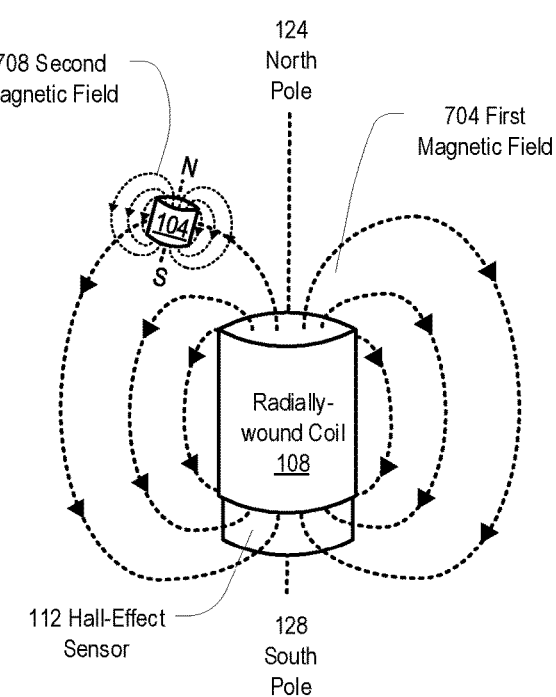
Figure 7D:
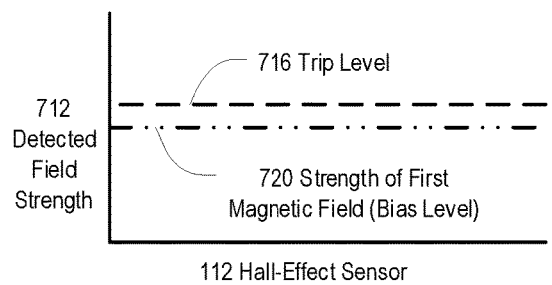
Figure 7D:
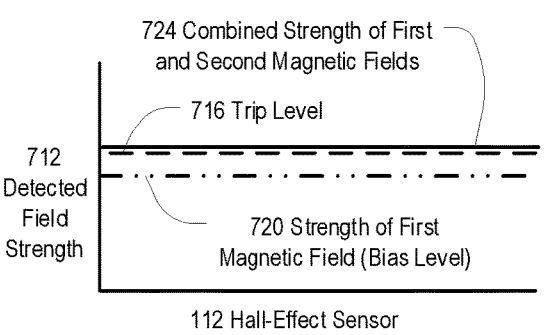

Referring now to FIG. 7C, a diagram illustrating magnetic object non-detection in partially sympathetic magnetic fields, in accordance with embodiments of the present application is shown. FIG. 7C illustrates a case where a magnet 104 enters a partially sympathetic magnetic field (first magnetic field 704) of the radially-wound coil 108. A partially sympathetic magnetic field where the first magnetic field 704 does not completely align or is completely opposed by the second magnetic field 708. In other words, there is an angular relationship between the first 704 and second 708 magnetic fields that is neither 0 nor 180 degrees. The partially sympathetic case illustrated in FIG. 7C applies to an angular relationship that contributes to the bias level 720, but not enough to exceed the trip level 716.

The illustration in FIG. 7C applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 is directly opposite the polarity of the second magnetic field 708.

The left side of FIG. 7C reflects the hall-effect sensor 112 does not detect the magnet 104. The first 704 and second 708 magnetic fields are partially sympathetically aligned, and the hall-effect sensor 112 does not detect the magnet 104 because the combination (sum) of the first magnetic field 704 and the second magnetic field 708 at the hall-effect sensor 112 does not exceed the trip level 716. The angle of the magnet 104 relative to the radially-wound coil 108 only produces a minor contribution in addition to the bias level 720.

The diagram in the lower left of FIG. 7C corresponds with the detection case in the upper left of FIG. 7C. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected.

The right side of FIG. 7C reflects the hall-effect sensor 112 still does not detect the magnet 104, even though the magnet 104 has moved into a detection distance. Because the first 704 and second 708 magnetic fields are only partially sympathetically aligned to a minor degree, the hall-effect sensor 112 cannot detect the magnet 104 because the combination (sum) of the first magnetic field 704 and the second magnetic field 708 at the hall-effect sensor 112 is less than the trip level 716.

The diagram in the lower right of FIG. 7C corresponds with the detection case in the upper right of FIG. 7C. Therefore, the detected field strength 712 (i.e. combined strength 724 of the first 704 and second 708 magnetic fields), although greater than the strength of the first magnetic field (bias level) 720, is still less than the trip level 716 for the hall-effect sensor 112. Because the trip level 716 has not been exceeded, the sensor output 144 is static—reflecting the magnet 104 has not been detected.

Referring now to FIG. 7D, a diagram illustrating magnetic object detection in partially sympathetic magnetic fields, in accordance with embodiments of the present application is shown. FIG. 7D illustrates a case where a magnet 104 enters a partially sympathetic magnetic field (first magnetic field 704) of the radially-wound coil 108. A partially sympathetic magnetic field where the first magnetic field 704 does not completely align or is completely opposed by the second magnetic field 708. In other words, there is an angular relationship between the first 704 and second 708 magnetic fields that is neither 0 nor 180 degrees. The partially sympathetic case illustrated in FIG. 7D applies to a more significant angular relationship in FIG. 7C, that contributes to the bias level 720 significantly enough to exceed the trip level 716.

The illustration in FIG. 7D applies to both unipolar and omnipolar sensing, but only illustrates the omnipolar case where the first magnetic field 704 has a positive polarity (i.e. where the north pole 124 extends toward the magnet 104, and the south pole 128 extends away from the magnet 104) and the polarity of the first magnetic field 704 is mostly aligned with the polarity of the second magnetic field 708.

The left side of FIG. 7D reflects the hall-effect sensor 112 does not detect the magnet 104. The first 704 and second 708 magnetic fields are partially sympathetically aligned, and the hall-effect sensor 112 does not detect the magnet 104 because the combination (sum) of the first magnetic field 704 and the second magnetic field 708 at the hall-effect sensor 112 does not exceed the trip level 716. The angle of the magnet 104 relative to the radially-wound coil 108 produces a major contribution to the bias level 720, but the separation between the magnet 104 and the hall-effect sensor 112 is too great to exceed the trip level 716.

The diagram in the lower left of FIG. 7D corresponds with the detection case in the upper left of FIG. 7D. Therefore, the detected field strength 712 (i.e. combination of the first 704 and second 708 magnetic fields) does not exceed the trip level 716 for the hall-effect sensor 112. Because the trip level 716 has not been exceeded, the sensor output 144 is static—reflecting no magnet 104 detected.

The right side of FIG. 7D reflects the hall-effect sensor 112 does detect the magnet 104, and the magnet 104 has moved into a detection distance. Even though the first 704 and second 708 magnetic fields are only partially sympathetically aligned to a major degree, the hall-effect sensor 112 does detect the magnet 104 because the combination (sum) of the first magnetic field 704 and the second magnetic field 708 at the hall-effect sensor 112 exceeds the trip level 716.

The diagram in the lower right of FIG. 7D corresponds with the detection case in the upper right of FIG. 7D. Therefore, the detected field strength 712 (i.e. combined strength 724 of the first 704 and second 708 magnetic fields) is greater than the strength of the first magnetic field (bias level) 720 as well as the trip level 716 for the hall-effect sensor 112. Because the trip level 716 has been exceeded, the sensor output 144 is active—reflecting the magnet 104 has been detected.

Figure 8:
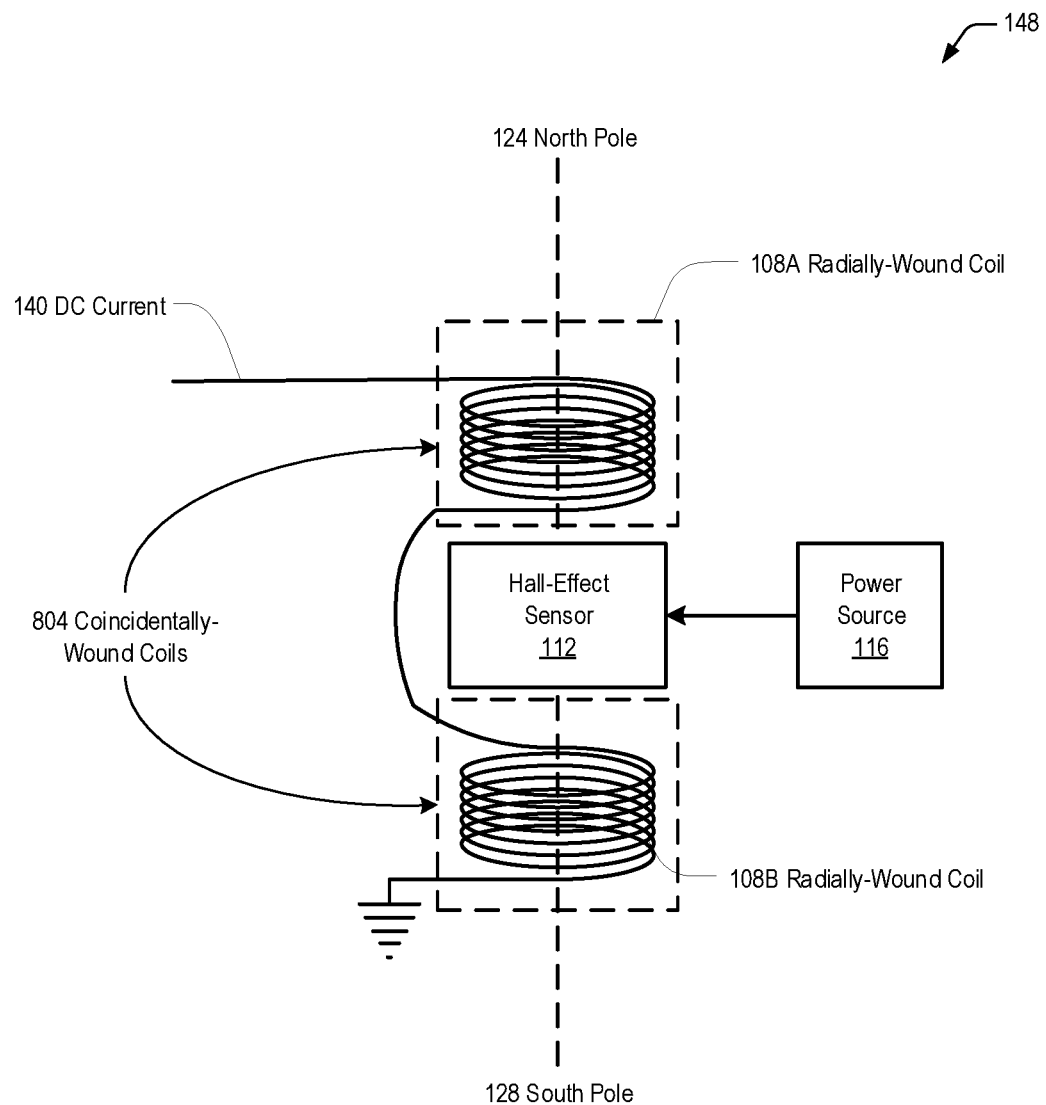
FIG. 8 is a diagram illustrating a dual-coil sense circuit, in accordance with embodiments of the present application.

Referring now to FIG. 8, a diagram illustrating a dual-coil sense circuit, in accordance with embodiments of the present application is shown. FIG. 1 illustrates a single-coil sense circuit 148 that includes a radially-wound coil 108, a hall-effect sensor 112, and a power source 116. That arrangement works well for magnets 104 on one side of the radially-wound coil 108.

However, for magnets 104 that may pass by either/both ends of the radially-wound coil 108, a dual-coil sense circuit 148 may be preferable. The dual-coil sense circuit 148 includes a hall-effect sensor 112 and power source 116 similar to the single-coil sense circuit 148, but includes two radially-wound coils 108, identified as radially-wound coil 108A and radially-wound coil 108B. The two coils 108A, 108B are identically and coincidentally wound 804 to each other, where both coils 108A, 108B are wound in a clockwise direction or both coils 108A, 108B are wound in a counterclockwise direction. A single DC current 140 source drives both coils 108A, 108B, and the coils 108A, 108B may be interconnected as shown.

Figure 9:
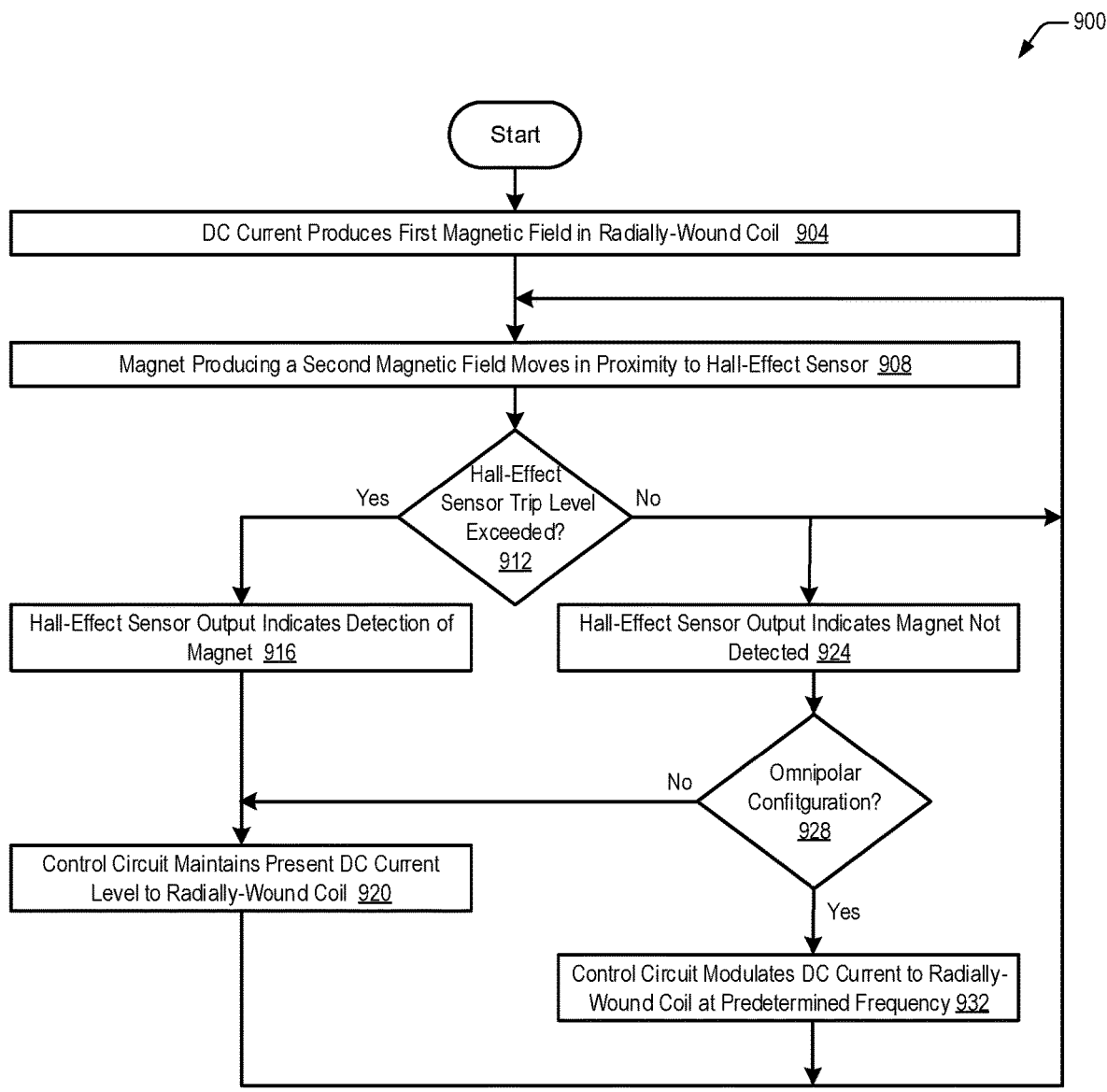
FIG. 9 is a flowchart illustrating a magnet detection process in accordance with embodiments of the present application.

Referring now to FIG. 9, a flowchart illustrating a magnet detection process 900 in accordance with embodiments of the present application is shown. Flow begins at block 904.

At block 904, a DC current 140 produces a first magnetic field 704 in a radially-wound coil 108. The DC current 140 corresponds to a bias level of a hall-effect sensor 112. Flow proceeds to block 908.

At block 908, a magnet 104 producing a second magnetic field 708 moves in proximity to the hall-effect sensor 112. The movement may be in any direction, combination of directions, velocity/velocities, and acceleration/accelerations. Flow proceeds to decision block 912.

At decision block 912, a determination is made if a trip level 716 of the hall-effect sensor 112 has been exceeded. If the trip level 716 of the hall-effect sensor 112 has been exceeded, then flow proceeds to block 916. If instead a trip level 716 of the hall-effect sensor 112 has not been exceeded, then flow instead proceeds to block 924.

At block 916, the hall-effect sensor trip level 716 has been exceeded, and an output of the hall-effect sensor 144 indicates detection of the magnet 104. Flow proceeds to block 920.

At block 920, a control circuit 120 maintains present DC current 140 levels to the radially-wound coil 108. Flow proceeds to block 908 to continue to track the magnet 104.

At block 924, the trip level 716 for the hall-effect sensor 112 has not been exceeded, and the sensor output 144 for the hall-effect sensor 112 does not indicate a magnet 104 is detected. Flow proceeds to decision block 928.

At decision block 928, operation changes based on whether the device is operating with an omnipolar configuration. If the device is not operating with an omnipolar sensing configuration (e.g. presumably with a unipolar configuration instead), then flow proceeds to block 920. If the device is operating with an omnipolar sensing configuration, then flow instead proceeds to block 932.

At block 932, the control circuit 120 modulates the DC current 140 to the radially-wound coil 108 at a predetermined frequency, in order to alternate the polarity of the first magnetic field 704 to better track magnets 104 with an unknown orientation. Flow proceeds to block 908 to continue to track the magnet 104.

Figure 10:
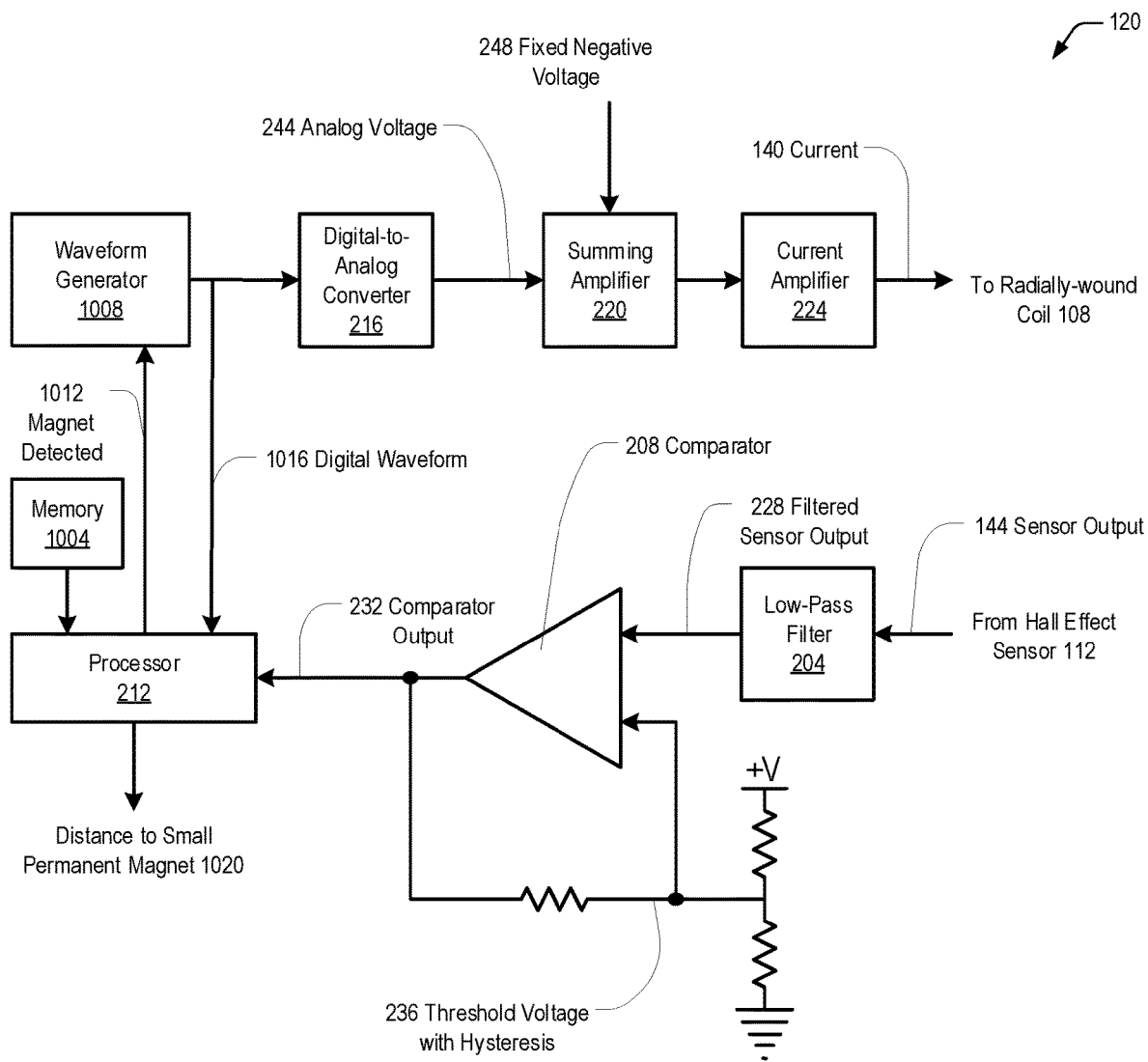
FIG. 10 is a block diagram illustrating a control circuit in accordance with a third embodiment of the present application.

Referring now to FIG. 10, a diagram illustrating a control circuit 120 in accordance with a third embodiment of the present application is shown. The third embodiment provides range detection for the magnet 104 when the magnet 104 is within a sensing range. The control circuit 120 receives a sensor output 144 from the hall-effect sensor 112, and provides a current 140 to the radially-wound coil 108.

The sensor output 144 is a generally "noisy" signal that indicates the hall-effect sensor 112 is currently detecting a magnet 104. It is advantageous to clean up the signal 144 in order that it may be accurately interpreted. In one embodiment, a low-pass filter 204 provides a filtered sensor output 228 to a comparator 208, which provides a clean comparator output 232 to be used by a processor 212. The comparator 208 compares the filtered sensor output 228 to a threshold voltage with hysteresis 236—which is a fed back form of the comparator output 232. The threshold voltage with hysteresis 236 utilizes voltage divider and feedback resistors to condition the comparator output 232 to levels optimized for the comparator 208. No specific values are shown since that is implementation-dependent and depends on the comparator 208 device used, characteristics of the filtered sensor output 228, and signaling requirements for the processor 212. Although the embodiment illustrated uses hardware low-pass filter 204 and comparator 208 components, it should be understood that many other forms of signal conditioning may be equivalently used without deviating from the scope or intention of the present application—including digital signal processing and software-based signal conditioning by the processor 212 or another device.

The processor 212 represents a central processing unit (CPU) and associated resources to interpret the comparator output 232 and digital waveform 1016. The processor 212 executes an operating system and one or more software applications, which are generally stored in a memory 1004.

The processor 212 may include any type of processor known in the art, including embedded CPUs, RISC CPUs, Intel or Apple-compatible CPUs, and may include any combination of hardware and software. Processor 212 may include several devices including field-programmable gate arrays (FPGAs), memory controllers, North Bridge devices, and/or South Bridge devices. Although in most embodiments, processor 212 fetches application program instructions and metadata from the memory 1004, it should be understood that processor 212 and applications may be configured in any allowable hardware/software configuration, including pure hardware configurations implemented in ASIC or FPGA forms.

The memory 1004 may include one or both of volatile and nonvolatile memory types. In some embodiments, the memory 1004 may include firmware which includes program instructions that processor 212 fetches and executes, including program instructions for the processes disclosed herein. Examples of non-volatile memory 1004 may include, but are not limited to, flash memory, SD, Erasable Programmable Read Only Memory (EPROM), Electrically Erasable Programmable Read Only Memory (EEPROM), hard disks, and Non-Volatile Read-Only Memory (NOVRAM). Volatile memory 1004 stores various data structures and user data. Examples of volatile memory 1004 may include, but are not limited to, Static Random Access Memory (SRAM), Dual Data Rate Random Access Memory (DDR RAM), Dual Data Rate 2 Random Access Memory (DDR2 RAM), Dual Data Rate 3 Random Access Memory (DDR3 RAM), Zero Capacitor Random Access Memory (Z-RAM), Twin-Transistor Random Access Memory (TTRAM), Asynchronous Random Access Memory (A-RAM), ETA Random Access Memory (ETA RAM), and other forms of temporary memory 1004. The memory 1004 may store any combination of metadata and one or more applications. Metadata may include various data structures in support of the operating system and software applications.

In one embodiment, the processor 212 provides a magnet detected signal 1012 to a waveform generator 1008, which is any form of hardware or software components that create digital waveforms 1016 that are used to generate a current 140 to the radially-wound coil 108. The magnet detected signal 1012 becomes active when the comparator output 232 indicates a magnet 104 detected by the hall-effect sensor 112, and becomes inactive when the comparator output 232 indicates a magnet 104 no longer detected by the hall-effect sensor 112. The processor 212 receives the digital waveform 1016 from the waveform generator 1008, samples the digital waveform 1016 when directed by the comparator output 232, looks up the sampled waveform (not shown) in the memory 1004 or an internal table, and outputs a distance to the small permanent magnet 1020. The lookup of the sampled waveform may provide a distance to the magnet 104 at the current sample time. The processor 212 may also include a time base or free running clock, and at each sample may extract a time stamp from the free running clock. In one embodiment, the processor 212 may provide a time stamp and distance data pair for each sample as an output 1020.

The waveform generator 1008 outputs the digital waveform 1016 to a digital-to-analog converter (DAC) 216 and to the processor 212. When the magnet detected signal 1012 indicates no magnet 104 is detected, the waveform generator 1008 outputs a first periodic digital waveform 1016A, and when a magnet 104 is detected, the waveform generator 1008 outputs a second periodic digital waveform 1016B, 1016C, 1016D, 1016E or a non-periodic third digital waveform 1016F, 1016G.

The digital-to-analog converter (DAC) 216 converts the digital waveform 1016 into an analog voltage 244. A summing amplifier 220 receives the analog voltage 244 and adds to it a fixed negative voltage 248 (which reflects the bias level for the hall-effect sensor 112). The summing amplifier 220 output drives a current amplifier 224, which provides the current 140 to the radially-wound coil 108. Like the filtering circuits 204, 208, it should be understood there are many different and equivalent circuits for converting the digital waveform 1016 from the waveform generator 1008 into the current 140 to the radially-wound coil 108. Use of such equivalent circuits may be used in lieu of the circuits shown without deviating from the scope or intent of the present application.

Figure 11:
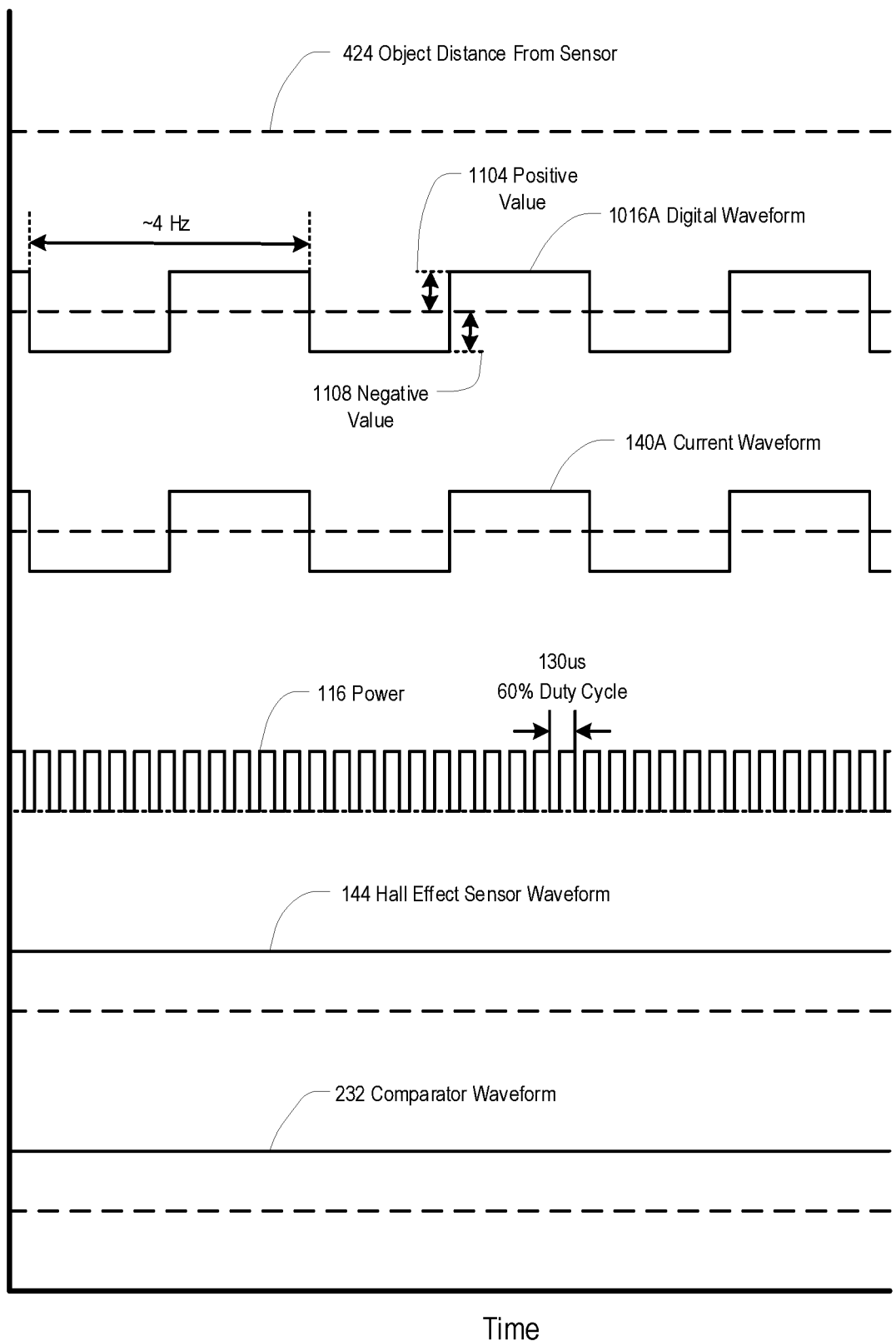
FIG. 11 is a diagram illustrating signal propagation when no object is detected, in accordance with the third embodiment of the present application.

Referring now to FIG. 11, a diagram illustrating signal propagation when no object 104 is detected, in accordance with the third embodiment of the present application is shown. FIG. 11 illustrates a case where no magnet 104 or object is detected by the sense circuit 148, in order to provide a corresponding description for other critical signals under those conditions.

Omnipolar sensing is magnet sensing using a dual magnetic polarity, and the third embodiment utilizes omnipolar sensing. This means that the first magnetic field 704 produced by the radially-wound coil 108 has a periodically alternating north and south orientation when no magnet or object 104 is detected. Omnipolar sensing requires an alternating current 140 to the radially-wound coil 108.

The top waveform illustrates no object (magnet 104) within a detection distance 424 from the hall-effect sensor 112. The power source 116 provides a modulated power input to the hall-effect sensor 112, as described with reference to FIG. 4A.

The hall-effect sensor waveform 144 and the comparator waveform 232 do not provide an indication of detecting the magnet 104. Because the third embodiment is configured with omnipolar sensing, the digital waveform 1016A and the current waveform 140A are periodically alternating waveforms when a magnet 104 is not detected.

The digital waveform 1016A and the current waveform 140A periodically alternate between a positive 1104 and a negative 1108 value in order to reverse the first magnetic field from the radially-wound coil 108. This has a major advantage when the polarity of the magnet 104 is unknown, unpredictable, or likely to change. The effect of this is described in more detail with respect to FIGS. 7A-7D. The period for the digital waveform 1016A and the current waveform 140A in the preferred embodiment may be approximately 4 Hz. However, in other embodiments the frequency of the digital waveform 1016A and the current waveform 140A may be greater than or less than 4 Hz, as long as magnets 104 move at a velocity that allows for reliable detection.

An advantage of the present application is it provides an ability to detect magnets 104 having any conceivable orientation/polarity. When a sensing circuit 148 is configured in an omnipolar configuration, a magnetic field 704 with alternating polarity is produced. The magnetic field 704 alternates between first and second (opposite to first) polarities and provides the greatest sensing sensitivity when a sympathetic field to the magnet 104 is produced.

Figure 12A:
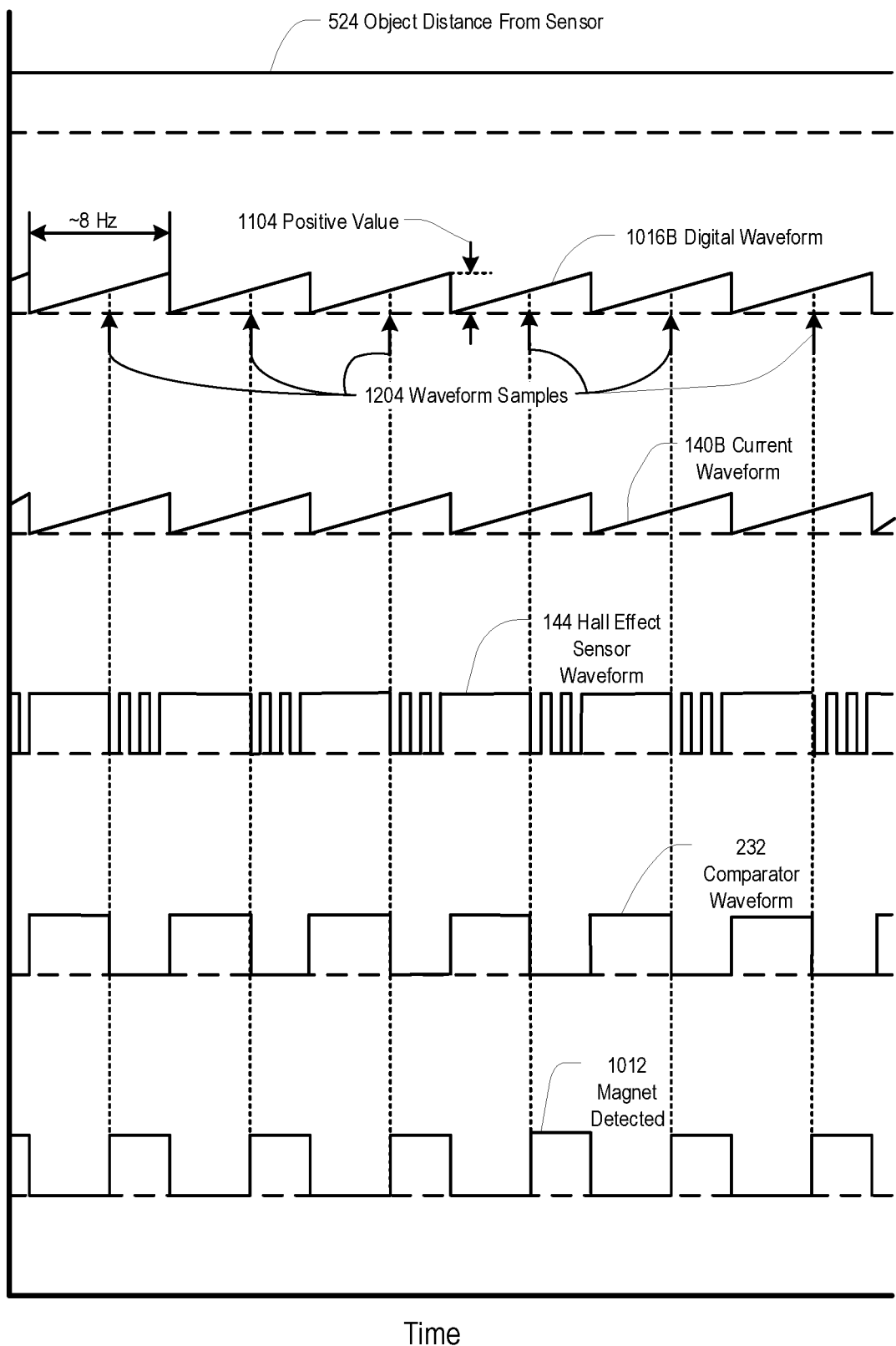
FIG. 12A is a diagram illustrating signal propagation when an object is at a fixed detected distance, in accordance with the third embodiment of the present application.

Referring now to FIG. 12A, a diagram illustrating signal propagation when an object 104 is detected at a fixed distance d in accordance with the third embodiment of the present application is shown. FIG. 12A illustrates a case where a magnet 104 or object has been previously detected by the sense circuit 148 and remains at a fixed distance d 132.

Figure 12B:
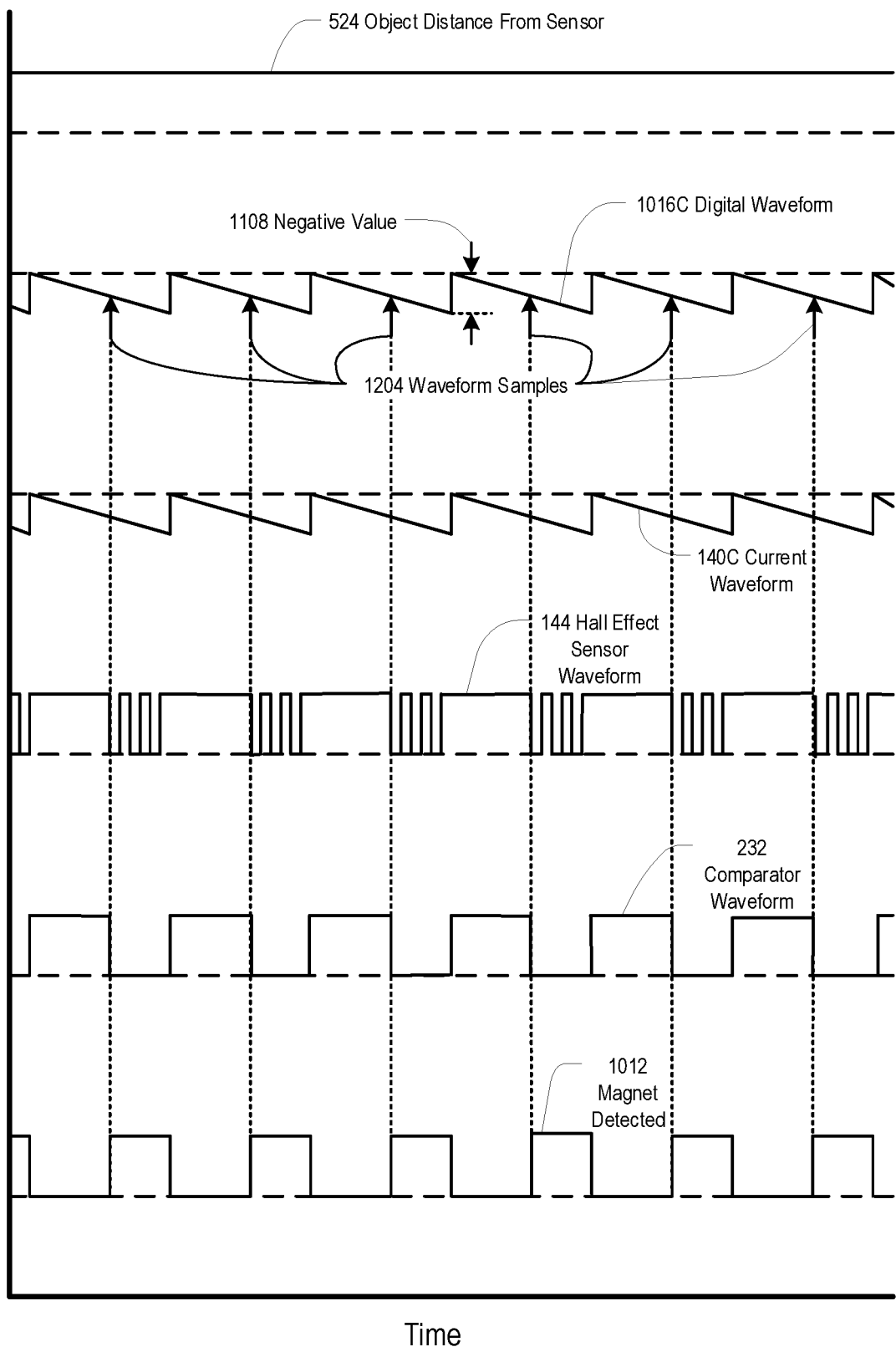
FIG. 12B is a diagram illustrating signal propagation when an object is at a fixed detected distance, in accordance with the third embodiment of the present application.
Figure 12C:
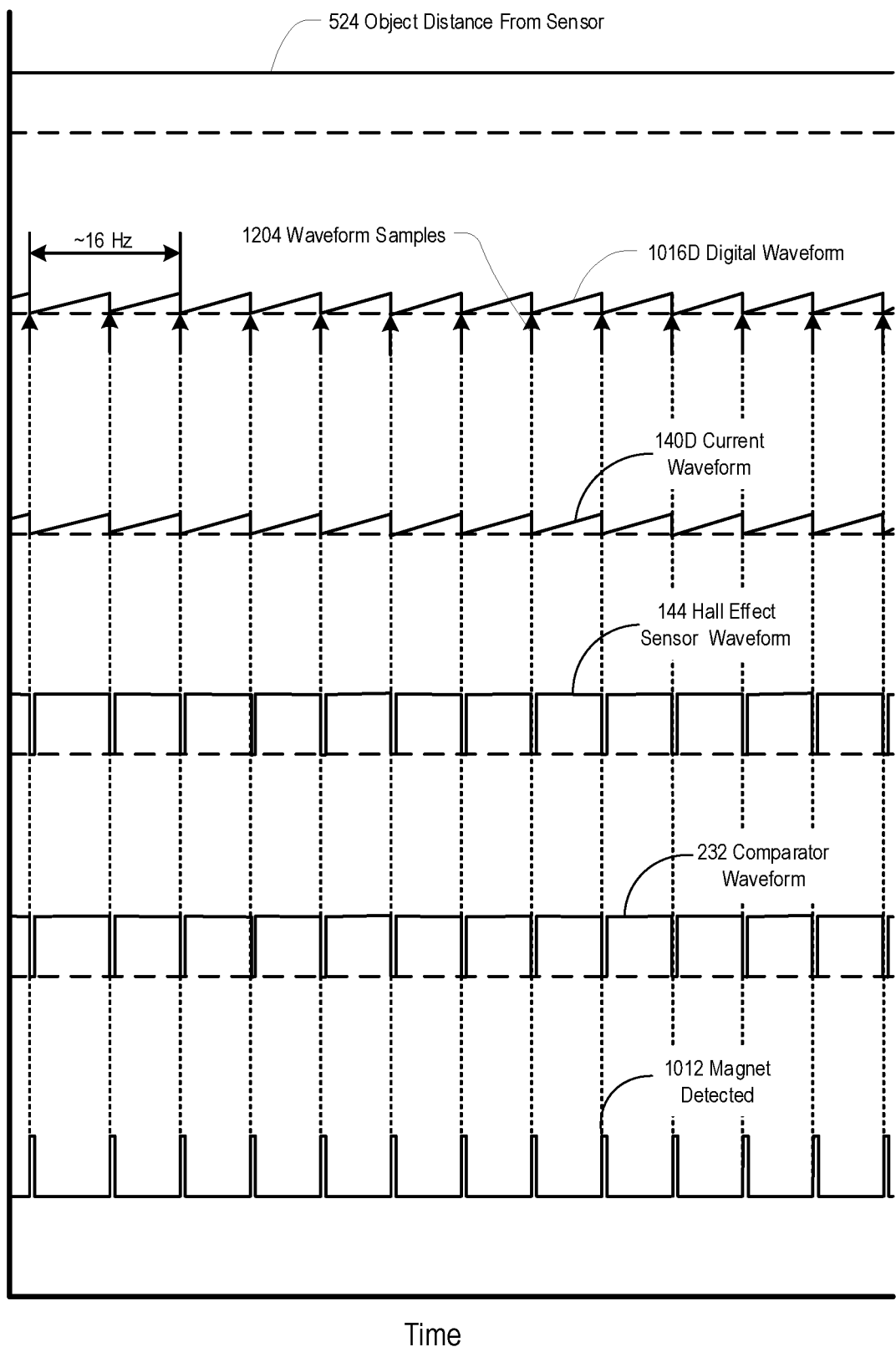
FIG. 12C is a diagram illustrating signal propagation when an object is at a fixed detected distance, in accordance with the third embodiment of the present application.
Figure 12D:
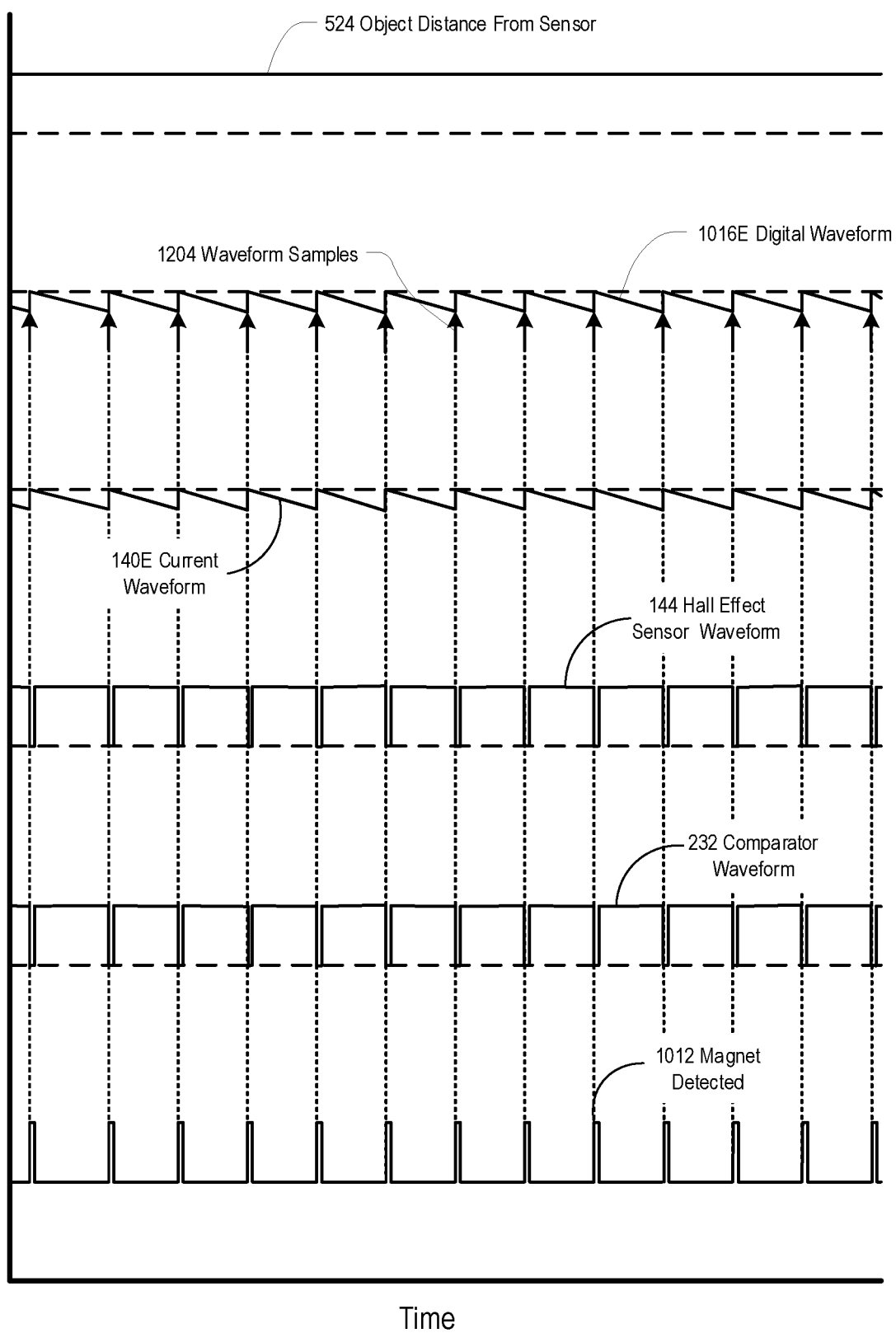
FIG. 12D is a diagram illustrating signal propagation when an object is at a fixed detected distance, in accordance with the third embodiment of the present application.

FIGS. 12A and 12B represent an embodiment where the digital waveform 1016B and current 140B are an unchanging ramped waveform with a fixed period, while the magnet or object 104 is detected. This embodiment is simpler to implement than alternative embodiments, but has the disadvantage of less efficient sensing. After waveform samples 1204 have been taken, the digital waveform 1016B and the current 140B continue until the end of the fixed period. During the continuation time, no additional data is being provided, since the magnet 104 distance was already determined at the sample time 1204. FIGS. 12C and 12D provide a more efficient embodiment, although requiring more complex implementation.

The top waveform illustrates an object (magnet 104) at a fixed detection distance 524 from the hall-effect sensor 112. The power source 116 provides a modulated power input to the hall-effect sensor 112, as described with reference to FIG. 4A.

The hall-effect sensor waveform 144 and the comparator waveform 232 each provide an indication of detecting the magnet 104. The digital waveform 1016B and the current waveform 140B ramp monotonically from a zero value to the positive value 1104 (i.e. the same positive value 1104 when a magnet 104 is not detected). However, the digital waveform 1016B and the current waveform 140B are both positive while the magnet 104 is detected. The reason for that has to do with sympathetic polarities between the first and second magnetic fields. Referring to FIGS. 7A and 7D, sympathetic magnetic fields are required in order to detect a magnet 104 since the second magnetic field 708 produced by the magnet 104 must add enough to the bias level for the first magnetic field 704 to exceed the trip level 716 for the hall-effect sensor 112. If the current 140A was "positive" when the magnet 104 was initially detected, it needs to remain "positive" 140B while the magnet 104 is sensed in order for the second magnetic field 708 to add enough to the bias level 720 to cause the trip level 716 to be exceeded.

The frequency from zero to the positive value 1104 for the digital waveform 1016B and the current ramp rate for the current waveform 140B in the preferred embodiment may be approximately 8 Hz. In other embodiments, the frequency of the digital waveform 1016B and the current waveform 140B may be 4 Hz. Additionally, in other embodiments it may be greater than or less than 4 Hz, as long as magnets 104 move at a velocity that allows for reliable detection.

The processor 212 samples the digital waveform 1016B at a leading edge of the magnet detected signal 1012. In some embodiments, sampling may take into account an expected velocity of the magnet 104 so that distance measurements 1020 have a desired granularity and resolution.

FIG. 12A assumes the magnet 104 has already been initially detected, and remains at a fixed range from the hall-effect sensor 112. The waveform current 140B increases at a predetermined rate. This in turn causes the strength of the first magnetic field 704 to increase with positive polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs a magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples the digital waveform 1016. The sampled value may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Referring now to FIG. 12B, a diagram illustrating signal propagation when an object is detected at a fixed distance d in accordance with the third embodiment of the present application is shown. FIG. 12B also illustrates a case where a magnet 104 or object has been previously detected by the sense circuit 148 and remains at a fixed distance d 132.

FIGS. 12A and 12B represent an embodiment where the digital waveform 1016C and current 140C are an unchanging ramped waveform with a fixed period, while the magnet or object 104 is detected. This embodiment is simpler to implement than alternative embodiments, but has the disadvantage of less efficient sensing. After waveform samples 1204 have been taken, the digital waveform 1016C and the current 140C continue until the end of the fixed period. During the continuation time, no additional data is being provided, since the magnet 104 distance was already determined at the sample time 1204. FIGS. 12C and 12D provide a more efficient embodiment to FIGS. 12A and 12B, although requiring more complex implementation.

The top waveform illustrates an object (magnet 104) at a fixed detection distance 524 from the hall-effect sensor 112. The power source 116 provides a modulated power input to the hall-effect sensor 112, as described with reference to FIG. 4A.

The hall-effect sensor waveform 144 and the comparator waveform 232 each provide an indication of detecting the magnet 104. The digital waveform 1016C and the current waveform 140C ramp monotonically from a zero value to the negative value 1108 (i.e. the same negative value 1108 when a magnet 104 is not detected). However, the digital waveform 1016C and the current waveform 140C are both negative while the magnet 104 is detected. The reason for that has to do with sympathetic polarities between the first and second magnetic fields. Referring to FIGS. 7A and 7D, sympathetic magnetic fields are required in order to detect a magnet 104 since the second magnetic field 708 produced by the magnet 104 must add enough to the bias level for the first magnetic field 704 to exceed the trip level 716 for the hall-effect sensor 112. If the current 140A was "negative" when the magnet 104 was initially detected, it needs to remain "negative" 140C while the magnet 104 is sensed in order for the second magnetic field 708 to add enough to the bias level 720 to cause the trip level 716 to be exceeded.

The frequency from zero to the negative value 1108 for the digital waveform 1016C and the current ramp rate for the current waveform 140C in the preferred embodiment may be approximately 8 Hz. In other embodiments, the frequency of the digital waveform 1016C and the current waveform 140C may be 4 Hz. However, in other embodiments the frequency may be greater than or less than 4 Hz, as long as magnets 104 move at a velocity that allows for reliable detection.

The processor 212 samples the digital waveform 1016C at a leading edge of the magnet detected signal 1012. In some embodiments, sampling may take into account an expected velocity of the magnet 104 so that distance measurements 1020 have a desired granularity and resolution.

FIG. 12B assumes the magnet 104 has already been initially detected, and remains at a fixed range from the hall-effect sensor 112. The waveform current 140C increases at a predetermined rate. This in turn causes the strength of the first magnetic field 704 to increase with negative polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs a magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples the digital waveform 1016. The sampled value may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Referring now to FIG. 12C, a diagram illustrating signal propagation when an object 104 is detected at a fixed distance d in accordance with the third embodiment of the present application is shown. FIG. 12C illustrates a case where a magnet 104 or object has been previously detected by the sense circuit 148 and remains at a fixed distance d 132.

The embodiments of FIGS. 12C and 12D represent a preferred embodiment of the present application when a magnet 104 has previously been detected and remains at a fixed distance d 132 from the hall-effect sensor 112. Unlike the embodiments described in FIGS. 12A and 12B that ramped the current 140 at a fixed and unchanging frequency, the embodiments described in FIGS. 12C and 12D immediately restore the current 140 to a zero value following magnet 104 detection, and resume the next ramp. Once the magnet 104 is detected, there is no advantage to continue ramping the current 140 afterward and this only slows the sample rate perhaps with the benefit of simpler implementation. The embodiment of FIGS. 12C and 12D increase the sampling rate by starting a next ramp earlier than in 12A/12B. In fact, as the magnet 104 moves even closer to the hall-effect sensor 112, the sampling frequency increases in proportion—resulting in tighter sampling granularity as the magnet 104 moves closer to the hall-effect sensor 112.

The top waveform illustrates an object (magnet 104) at a fixed detection distance 524 from the hall-effect sensor 112. The power source 116 provides a modulated power input to the hall-effect sensor 112, as described with reference to FIG. 4A.

The hall-effect sensor waveform 144 and the comparator waveform 232 each provide an indication of detecting the magnet 104. The digital waveform 1016D and the current waveform 140D ramp monotonically from a zero value at a predetermined rate. However, the digital waveform 1016D and the current waveform 140D are both positive while the magnet 104 is detected. The reason for that has to do with sympathetic polarities between the first and second magnetic fields. Referring to FIGS. 7A and 7D, sympathetic magnetic fields are required in order to detect a magnet 104 since the second magnetic field 708 produced by the magnet 104 must add enough to the bias level for the first magnetic field 704 to exceed the trip level 716 for the hall-effect sensor 112. If the current 140A was "positive" when the magnet 104 was initially detected, it needs to remain "positive" 140D while the magnet 104 is sensed in order for the second magnetic field 708 to add enough to the bias level 720 to cause the trip level 716 to be exceeded.

It should be noted that, depending on the detected range from the waveform samples 1204, the digital waveform 1016D may not reach the positive value 1104 because the ramp "resets" back to zero as soon as the magnet 104 is detected. The only time the positive value 1104 may be reached in the embodiment of FIG. 12C is when the magnet 104 is at a maximum detection range, which corresponds to the positive value 1104. The processor 212 samples the digital waveform 1016D at a leading edge of the magnet detected signal 1012.

FIG. 12C assumes the magnet 104 has already been initially detected, and remains at a fixed range from the hall-effect sensor 112. The waveform current 140D increases at a predetermined rate. This in turn causes the strength of the first magnetic field 704 to increase with positive polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs a magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples the digital waveform 1016. The sampled value may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Referring now to FIG. 12D, a diagram illustrating signal propagation when an object is detected at a fixed distance d in accordance with the third embodiment of the present application is shown. FIG. 12D also illustrates a case where a magnet 104 or object has been previously detected by the sense circuit 148 and remains at a fixed distance d 132.

The embodiments of FIGS. 12C and 12D represent a preferred embodiment of the present application when a magnet 104 has previously been detected and remains at a fixed distance d 132 from the hall-effect sensor 112. Unlike the embodiments described in FIGS. 12A and 12B that ramped the current 140 at a fixed and unchanging frequency, the embodiments described in FIGS. 12C and 12D immediately restore the current 140 to a zero value following magnet 104 detection, and resume the next ramp. Once the magnet 104 is detected, there is no advantage to continue ramping the current 140 afterward and this only slows the sample rate perhaps with the benefit of simpler implementation. The embodiment of FIGS. 12C and 12D increase the sampling rate by starting a next ramp earlier than in 12A/12B. In fact, as the magnet 104 moves even closer to the hall-effect sensor 112, the sampling frequency increases in proportion—resulting in tighter sampling granularity as the magnet 104 moves closer to the hall-effect sensor 112.

The top waveform illustrates an object (magnet 104) at a fixed detection distance 524 from the hall-effect sensor 112. The power source 116 provides a modulated power input to the hall-effect sensor 112, as described with reference to FIG. 4A.

The hall-effect sensor waveform 144 and the comparator waveform 232 each provide an indication of detecting the magnet 104. The digital waveform 1016E and the current waveform 140E ramp monotonically from a zero value at a predetermined rate. However, the digital waveform 1016E and the current waveform 140E are both negative while the magnet 104 is detected. The reason for that has to do with sympathetic polarities between the first and second magnetic fields. Referring to FIGS. 7A and 7D, sympathetic magnetic fields are required in order to detect a magnet 104 since the second magnetic field 708 produced by the magnet 104 must add enough to the bias level for the first magnetic field 704 to exceed the trip level 716 for the hall-effect sensor 112. If the current 140A was "negative" when the magnet 104 was initially detected, it needs to remain "negative" 140E while the magnet 104 is sensed in order for the second magnetic field 708 to add enough to the bias level 720 to cause the trip level 716 to be exceeded.

It should be noted that, depending on the detected range from the waveform samples 1204, the digital waveform 1016E may not reach the negative value 1108 because the ramp "resets" back to zero as soon as the magnet 104 is detected. The only time the negative value 1108 may be reached in the embodiment of FIG. 12D is when the magnet 104 is at a maximum detection range, which corresponds to the negative value 1108. The processor 212 samples the digital waveform 1016E at a leading edge of the magnet detected signal 1012.

FIG. 12D assumes the magnet 104 has already been initially detected, and remains at a fixed range from the hall-effect sensor 112. The waveform current 140E increases at a predetermined rate. This in turn causes the strength of the first magnetic field 704 to increase with negative polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs a magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples the digital waveform 1016. The sampled value may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Figure 13A:
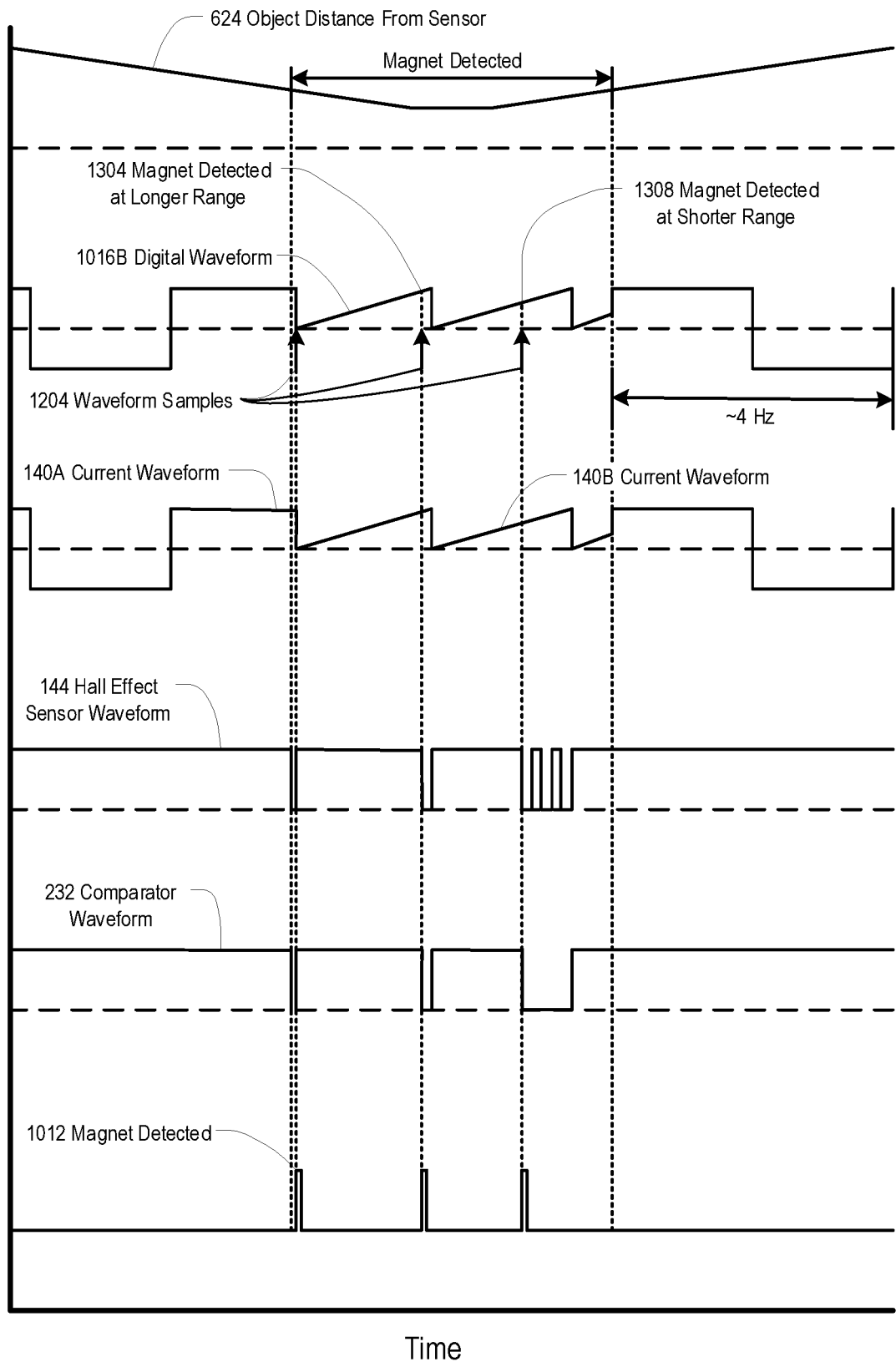
FIG. 13A is a diagram illustrating signal propagation when an object is moving toward a sensor, then away, in accordance with the third embodiment of the present application.

Referring now to FIG. 13A, a diagram illustrating signal propagation when an object is moving toward a sensor then away in accordance with embodiments of the present application is shown. FIG. 13A illustrates a case where a magnet 104 or object is initially detected by the sense circuit 148, stays within detection range for a time, then moves out of detection range. While the magnet 104 is detected, it is first detected at a longer range 1304, then at a shorter range 1308.

Figure 13B:
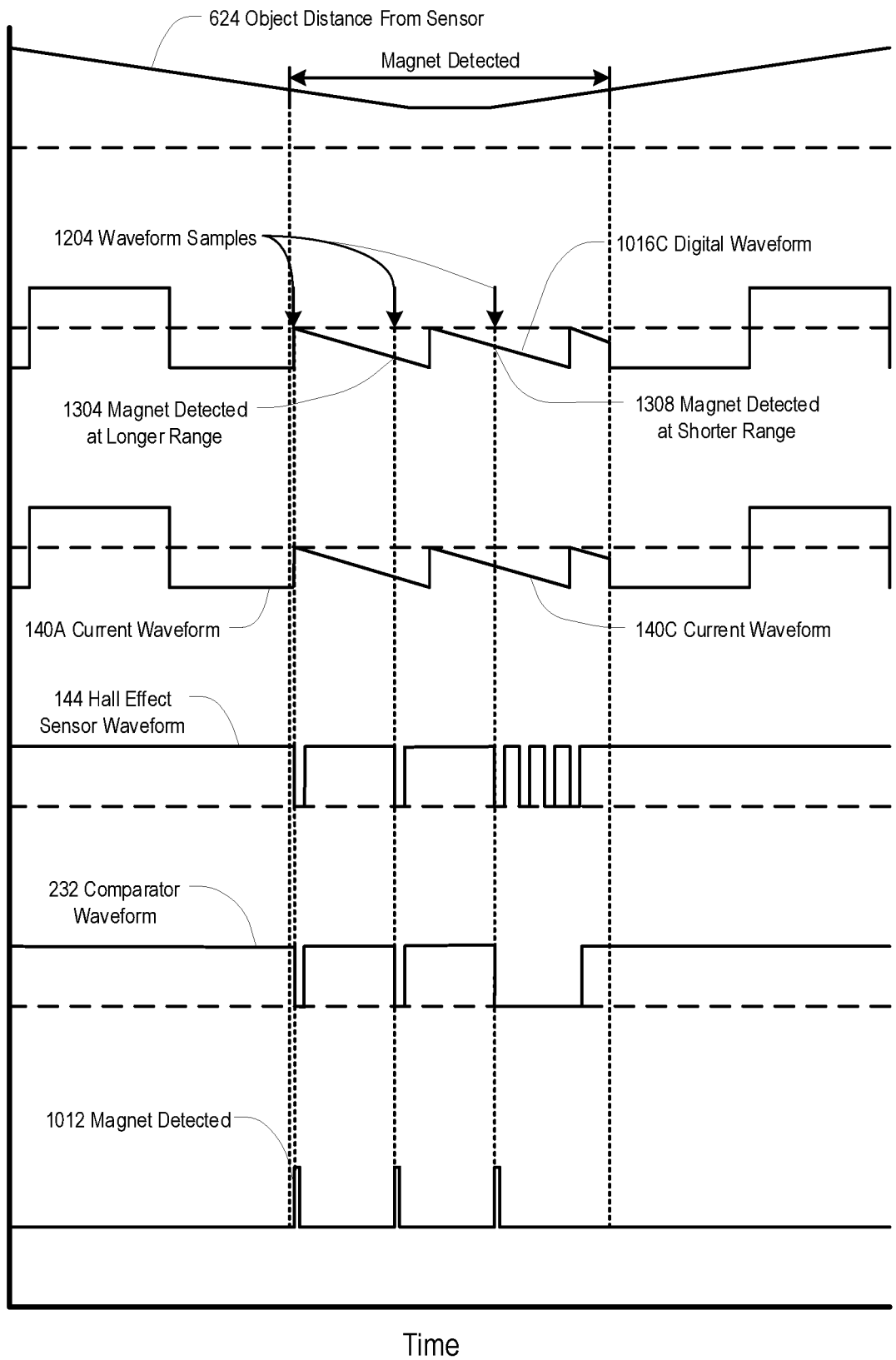
FIG. 13B is a diagram illustrating signal propagation when an object is moving toward a sensor, then away, in accordance with the third embodiment of the present application.
Figure 13C:
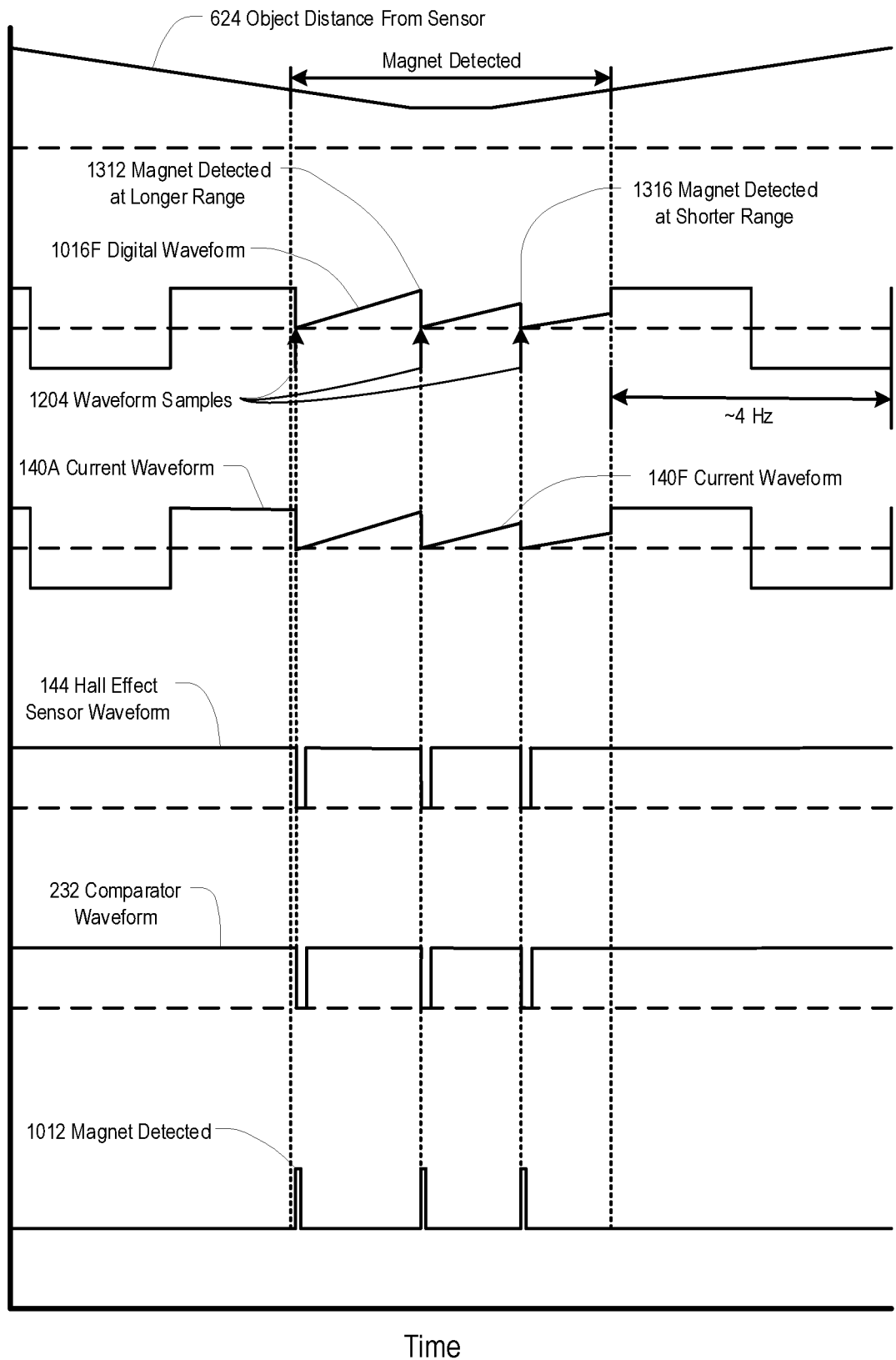
FIG. 13C is a diagram illustrating signal propagation when an object is moving toward a sensor, then away, in accordance with the third embodiment of the present application.
Figure 13D:
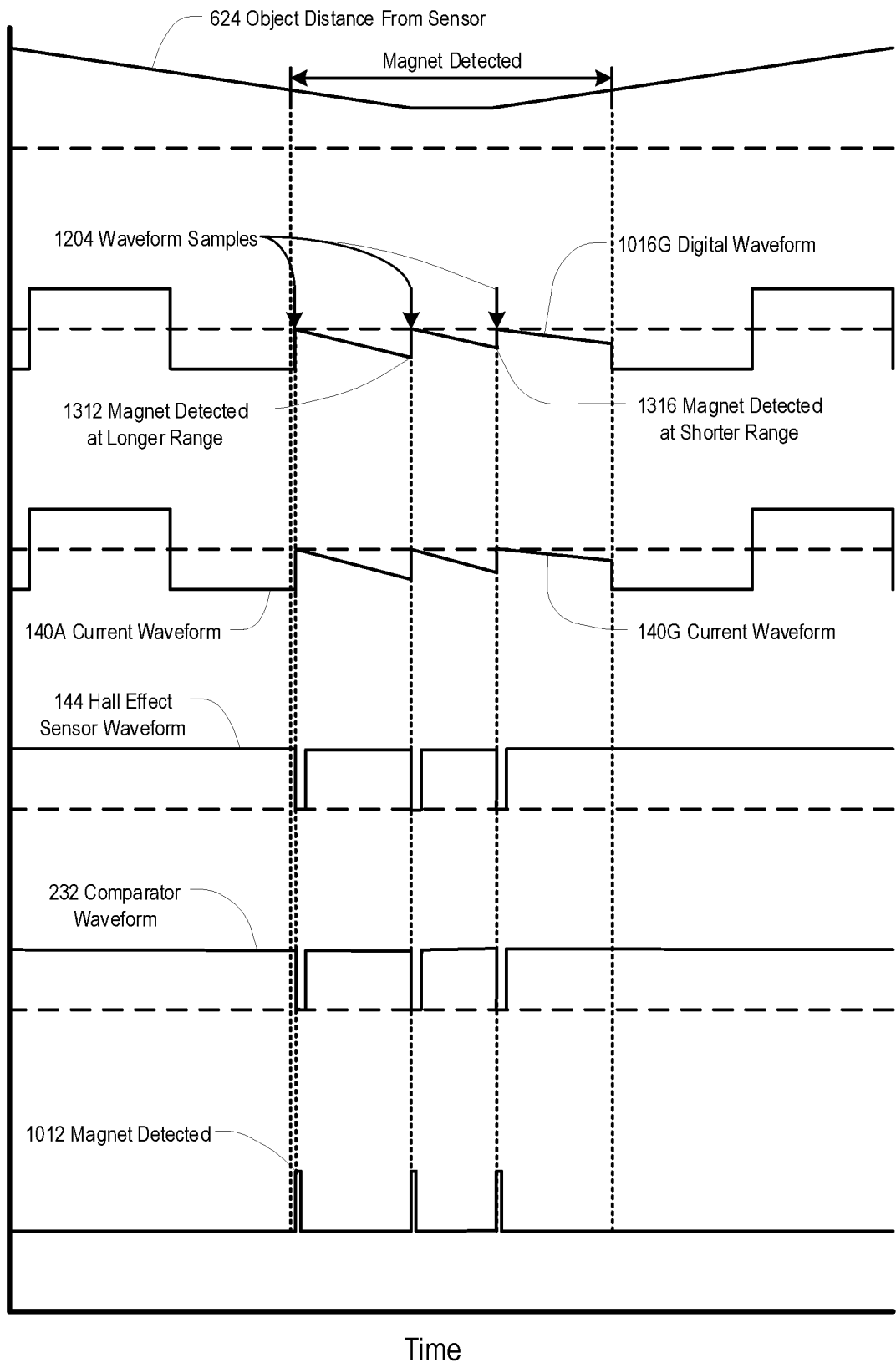
FIG. 13D is a diagram illustrating signal propagation when an object is moving toward a sensor, then away, in accordance with the third embodiment of the present application.

FIGS. 13A and 13B represent an embodiment where the digital waveform 1016B and current 140B are an unchanging ramped waveform with a fixed period, while the magnet or object 104 is detected. This embodiment is simpler to implement than alternative embodiments, but has the disadvantage of less efficient sensing. After waveform samples 1204 have been taken, the digital waveform 1016B and the current 140B continue until the end of the fixed period. During the continuation time, no additional data is being provided, since the magnet 104 distance was already determined at the sample time 1204. FIGS. 13C and 13D provide a more efficient embodiment, although requiring more complex implementation.

The top waveform illustrates an object (magnet 104) at a variable detection distance from the hall-effect sensor 624. The magnet 104 initially is at a greater distance than a maximum detection range from the hall-effect sensor 112, and the hall-effect sensor 112 does not detect the magnet 104. As the magnet 104 moves closer to the hall-effect sensor 112, the magnet 104 moves within a detection range and is detected. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, after remaining within detection distance for a time, the magnet 104 moves beyond distance d 132 and is no longer detected. The power source 116 provides a modulated power input to the hall-effect sensor 112, as described with reference to FIG. 4A.

The hall-effect sensor waveform 144 and the comparator waveform 232 each provide a negative indication of detecting the magnet 104 both before the magnet 104 is detected and after the magnet 104 is no longer detected. However, while the magnet 104 is detected, the hall-effect sensor waveform 144 indicates a modulated waveform with similar characteristics to the power source 116. Because of the low-pass filter 204 and the comparator 208, the waveform is "cleaned up" so that a clean comparator waveform 232 is produced to the processor 212.

The digital waveform 1016 and the current waveform 140 are each alternating waveforms 1016A, 140A when the magnet 104 is not detected, as described with reference to FIG. 11. At the time the magnet 104 is first detected, both the digital waveform 1016A and the current waveform 140A happen to have positive values. As described with reference to FIG. 12A, if the digital waveform 1016A and the current 140A were "positive" when the magnet 104 was initially detected, it needs to remain "positive" 1016B, 140B while the magnet 104 is sensed in order for the second magnetic field 708 to add enough to the bias level 720 to cause the trip level 716 to be exceeded.

While the magnet 104 is detected, the current waveform 140B increases at a predetermined rate. This in turn causes the strength of the first magnetic field 704 to increase with positive polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs the magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples 1204 the digital waveform 1016. The sampled value 1204 may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Referring now to FIG. 13B, a diagram illustrating signal propagation when an object is moving toward a sensor then away in accordance with embodiments of the present application is shown. FIG. 13B illustrates a case where a magnet 104 or object is initially detected by the sense circuit 148, stays within detection range for a time, then moves out of detection range. While the magnet 104 is detected, it is first detected at a longer range 1304, then at a shorter range 1308.

FIGS. 13A and 13B represent an embodiment where the digital waveform 1016C and current 140C are an unchanging ramped waveform with a fixed period, while the magnet or object 104 is detected. This embodiment is simpler to implement than alternative embodiments, but has the disadvantage of less efficient sensing. After waveform samples 1204 have been taken, the digital waveform 1016C and the current 140C continue until the end of the fixed period. During the continuation time, no additional data is being provided, since the magnet 104 distance was already determined at the sample time 1204. FIGS. 13C and 13D provide a more efficient embodiment over FIGS. 13A and 13B, although requiring more complex implementation.

The top waveform illustrates an object (magnet 104) at a variable detection distance from the hall-effect sensor 624. The magnet 104 initially is at a maximum detection range from the hall-effect sensor 112, and the hall-effect sensor 112 does not detect the magnet 104. As the magnet 104 moves closer to the hall-effect sensor 112, the magnet 104 moves within a detection range and is detected. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, after remaining within detection distance for a time, the magnet 104 moves beyond the maximum detection distance and is no longer detected. The power source 116 provides a modulated power input to the hall-effect sensor 112, as described with reference to FIG. 4A.

The hall-effect sensor waveform 144 and the comparator waveform 232 each provide a negative indication of detecting the magnet 104 both before the magnet 104 is detected and after the magnet 104 is no longer detected. However, while the magnet 104 is detected, the hall-effect sensor waveform 144 indicates a modulated waveform with similar characteristics to the power source 116. Because of the low-pass filter 204 and the comparator 208, the waveform is "cleaned up" so that a clean comparator waveform 232 is produced to the processor 212.

The digital waveform 1016 and the current waveform 140 are each alternating waveforms 1016A, 140A when the magnet 104 is not detected, as described with reference to FIG. 11. At the time the magnet 104 is first detected, both the digital waveform 1016A and the current waveform 140A happen to have negative values. As described with reference to FIG. 12B, if the digital waveform 1016A and the current 140A were "negative" when the magnet 104 was initially detected, they need to remain "negative" 1016C, 140C while the magnet 104 is sensed in order for the second magnetic field 708 to add enough to the bias level 720 to cause the trip level 716 to be exceeded.

While the magnet 104 is detected, the current waveform 140C decreases at a predetermined rate. This in turn causes the strength of the first magnetic field 704 to increase with negative polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs the magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples 1204 the digital waveform 1016. The sampled value 1204 may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Referring now to FIG. 13C, a diagram illustrating signal propagation when an object is moving toward a sensor then away in accordance with embodiments of the present application is shown. FIG. 13C illustrates a case where a magnet 104 or object is initially detected by the sense circuit 148, stays within detection range for a time, then moves out of detection range. While the magnet 104 is detected, it is first detected at a longer range 1312, then at a shorter range 1316.

The embodiments of FIGS. 13C and 13D represent a preferred embodiment of the present application. Unlike the embodiments described in FIGS. 13A and 13B that ramped the current 140 at a fixed and unchanging frequency, the embodiments described in FIGS. 13C and 13D immediately restore the current 140 to a zero value following magnet 104 detection, and resume the next ramp. Once the magnet 104 is detected, there is no advantage to continue ramping the current 140 afterward and this only slows the sample rate perhaps with the benefit of simpler implementation. The embodiment of FIGS. 13C and 13D increase the sampling rate by starting a next ramp earlier than in 13A/13B. In fact, as the magnet 104 moves even closer to the hall-effect sensor 112, the sampling frequency increases in proportion—resulting in tighter sampling granularity as the magnet 104 moves closer to the hall-effect sensor 112.

The top waveform illustrates an object (magnet 104) at a variable detection distance from the hall-effect sensor 624. The magnet 104 initially is at a greater distance than a maximum detection range from the hall-effect sensor 112, and the hall-effect sensor 112 does not detect the magnet 104. As the magnet 104 moves closer to the hall-effect sensor 112, the magnet 104 moves within a detection range and is detected. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, after remaining within detection distance for a time, the magnet 104 moves beyond a maximum detection distance and is no longer detected. The power source 116 provides a modulated power input to the hall-effect sensor 112, as described with reference to FIG. 4A.

The hall-effect sensor waveform 144 and the comparator waveform 232 each provide a negative indication of detecting the magnet 104 both before the magnet 104 is detected and after the magnet 104 is no longer detected. However, while the magnet 104 is detected, the hall-effect sensor waveform 144 indicates a modulated waveform with similar characteristics to the power source 116. Because of the low-pass filter 204 and the comparator 208, the waveform is "cleaned up" so that a clean comparator waveform 232 is produced to the processor 212.

The digital waveform 1016 and the current waveform 140 are each alternating waveforms 1016A, 140A when the magnet 104 is not detected, as described with reference to FIG. 11. At the time the magnet 104 is first detected, both the digital waveform 1016A and the current waveform 140A happen to have positive values. As described with reference to FIG. 13A, if the digital waveform 1016A and the current 140A were "positive" when the magnet 104 was initially detected, it needs to remain "positive" 1016F, 140F while the magnet 104 is sensed in order for the second magnetic field 708 to add enough to the bias level 720 to cause the trip level 716 to be exceeded.

While the magnet 104 is detected, the digital waveform 1016F and the current waveform 140B increase at a predetermined rate. This in turn causes the strength of the first magnetic field 704 to increase with positive polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs the magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples 1204 the digital waveform 1016. The sampled value 1204 may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Referring now to FIG. 13D, a diagram illustrating signal propagation when an object is moving toward a sensor then away in accordance with embodiments of the present application is shown. FIG. 13D illustrates a case where a magnet 104 or object is initially detected by the sense circuit 148, stays within detection range for a time, then moves out of detection range. While the magnet 104 is detected, it is first detected at a longer range 1312, then at a shorter range 1316.

The embodiments of FIGS. 13C and 13D represent a preferred embodiment of the present application. Unlike the embodiments described in FIGS. 13A and 13B that ramped the current 140 at a fixed and unchanging frequency, the embodiments described in FIGS. 13C and 13D immediately restore the current 140 to a zero value following magnet 104 detection, and resume the next ramp. Once the magnet 104 is detected, there is no advantage to continue ramping the current 140 afterward and this only slows the sample rate perhaps with the benefit of simpler implementation. The embodiment of FIGS. 13C and 13D increase the sampling rate by starting a next ramp earlier than in 13A/13B. In fact, as the magnet 104 moves even closer to the hall-effect sensor 112, the sampling frequency increases in proportion—resulting in tighter sampling granularity as the magnet 104 moves closer to the hall-effect sensor 112.

The top waveform illustrates an object (magnet 104) at a variable detection distance from the hall-effect sensor 624. The magnet 104 initially is at a maximum detection range from the hall-effect sensor 112, and the hall-effect sensor 112 does not detect the magnet 104. As the magnet 104 moves closer to the hall-effect sensor 112, the magnet 104 moves within a detection range and is detected. In some cases, this may be when at a detection distance d 132. However, if the magnet 104 is not fully sympathetically aligned with the first magnetic field 704 (i.e. reflected in FIGS. 7C-7D), it may need to be closer than distance d 132 in order to be detected. Finally, after remaining within detection distance for a time, the magnet 104 moves beyond the maximum detection distance and is no longer detected. The power source 116 provides a modulated power input to the hall-effect sensor 112, as described with reference to FIG. 4A.

The hall-effect sensor waveform 144 and the comparator waveform 232 each provide a negative indication of detecting the magnet 104 both before the magnet 104 is detected and after the magnet 104 is no longer detected. However, while the magnet 104 is detected, the hall-effect sensor waveform 144 indicates a modulated waveform with similar characteristics to the power source 116. Because of the low-pass filter 204 and the comparator 208, the waveform is "cleaned up" so that a clean comparator waveform 232 is produced to the processor 212.

The digital waveform 1016 and the current waveform 140 are each alternating waveforms 1016A, 140A when the magnet 104 is not detected, as described with reference to FIG. 11. At the time the magnet 104 is first detected, both the digital waveform 1016A and the current waveform 140A happen to have negative values. As described with reference to FIG. 13B, if the digital waveform 1016A and the current 140A were "negative" when the magnet 104 was initially detected, they need to remain "negative" 1016G, 140G while the magnet 104 is sensed in order for the second magnetic field 708 to add enough to the bias level 720 to cause the trip level 716 to be exceeded.

While the magnet 104 is detected, the digital waveform 1016G and the current waveform 140G decreases at a predetermined rate. This in turn causes the strength of the first magnetic field 704 to increase with negative polarity in proportion. At some point, the combination of the first magnetic field 704 and the second magnetic field 708 exceeds the trip level 716 for the hall-effect sensor 112. This causes the hall-effect sensor waveform 144 to drop to an active low state, reflecting detection of the magnet 104. The comparator output 232 filters the hall-effect sensor waveform 144 to produce a clean signal to the processor 212, and in the illustrated logic produces active low magnet 104 detection. The processor 212 in response outputs the magnet detected 1012 signal to the waveform generator 1008. In the illustrated logic, an active high magnet detected signal 1012 is shown. There may be another signal or signals required from the processor 212 to the waveform generator 1008 (not shown in FIG. 10) to communicate whether the waveform generator 1008 should be outputting the digital waveform 1016A when no object is detected or one of several ramped waveforms 1016B/C/D/E/F/G while the magnet or object 104 is detected. In response to the leading edge of the magnet detected 1012 signal, the processor 212 samples 1204 the digital waveform 1016. The sampled value 1204 may be cross-referenced with a table stored in memory 1004 or elsewhere to determine the distance d 132 of the magnet or object 104 from the hall-effect sensor 112. Finally, the distance to the small permanent magnet 1020 may be generated by the processor 212, possibly in conjunction with an associated time stamp, and transmitted elsewhere, stored, or displayed as needed.

Figure 14:
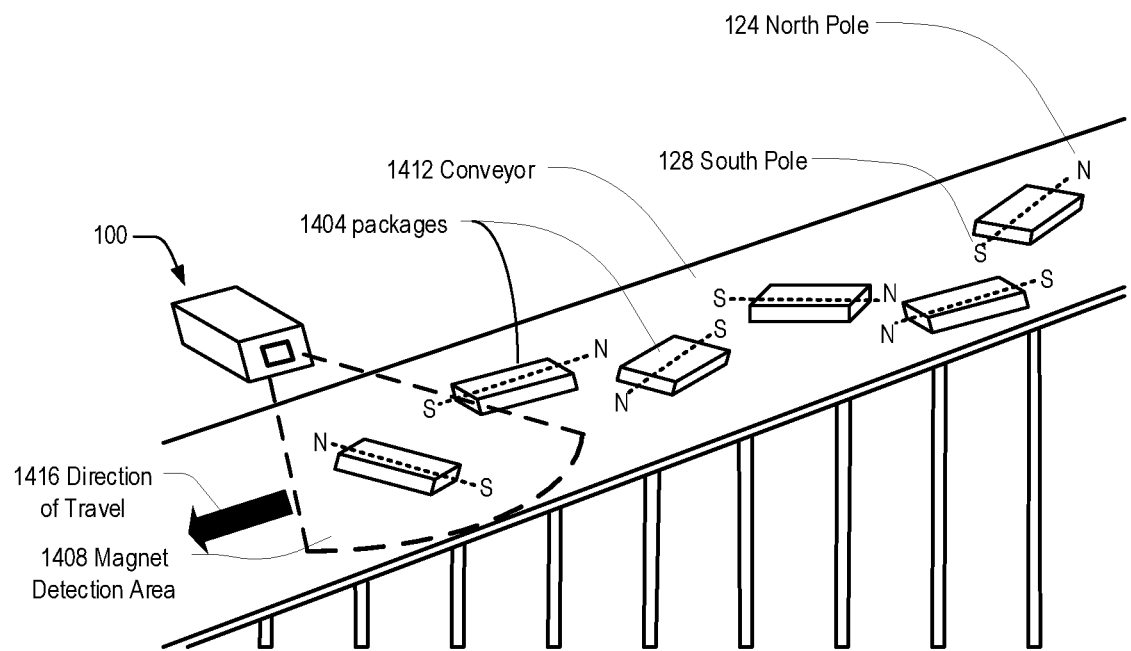
FIG. 14 is a diagram illustrating a practical package sorting application, in accordance with the third embodiment of the present application.

Referring now to FIG. 14, a diagram illustrating a practical package sorting application, in accordance with the third embodiment of the present application is shown. FIG. 14 illustrates many packages 1404 to be sorted by the magnet sensing device 100 of the third embodiment. The magnet sensing device 100 has an associated magnet detection area 1408, which may be a conical area within a maximum detection range of a hall-effect sensor 112.

Packages 1404 passing down a conveyor 1412 in a direction of travel 1416 pass in front of the magnet sensing device 100. Each package 1404 has affixed to it a small permanent magnet 104 preferably oriented with respect to a package 1404 length or width axis. Each magnet 104 has an associated north pole 124 and an opposite south pole 128, producing a second magnetic field 708 (not shown). The magnet sensing device 100 includes a radially-wound coil 108 that has an associated first magnetic field 704 (not shown). The interaction of the first magnetic field 704 with the second magnetic fields 708 produces the interactions described in FIGS. 11-13D to produce a distance 1020 and possibly a time stamp for each package 1404, which may be valuable in package 1404 sorting and organizing operations.

Figure 15:
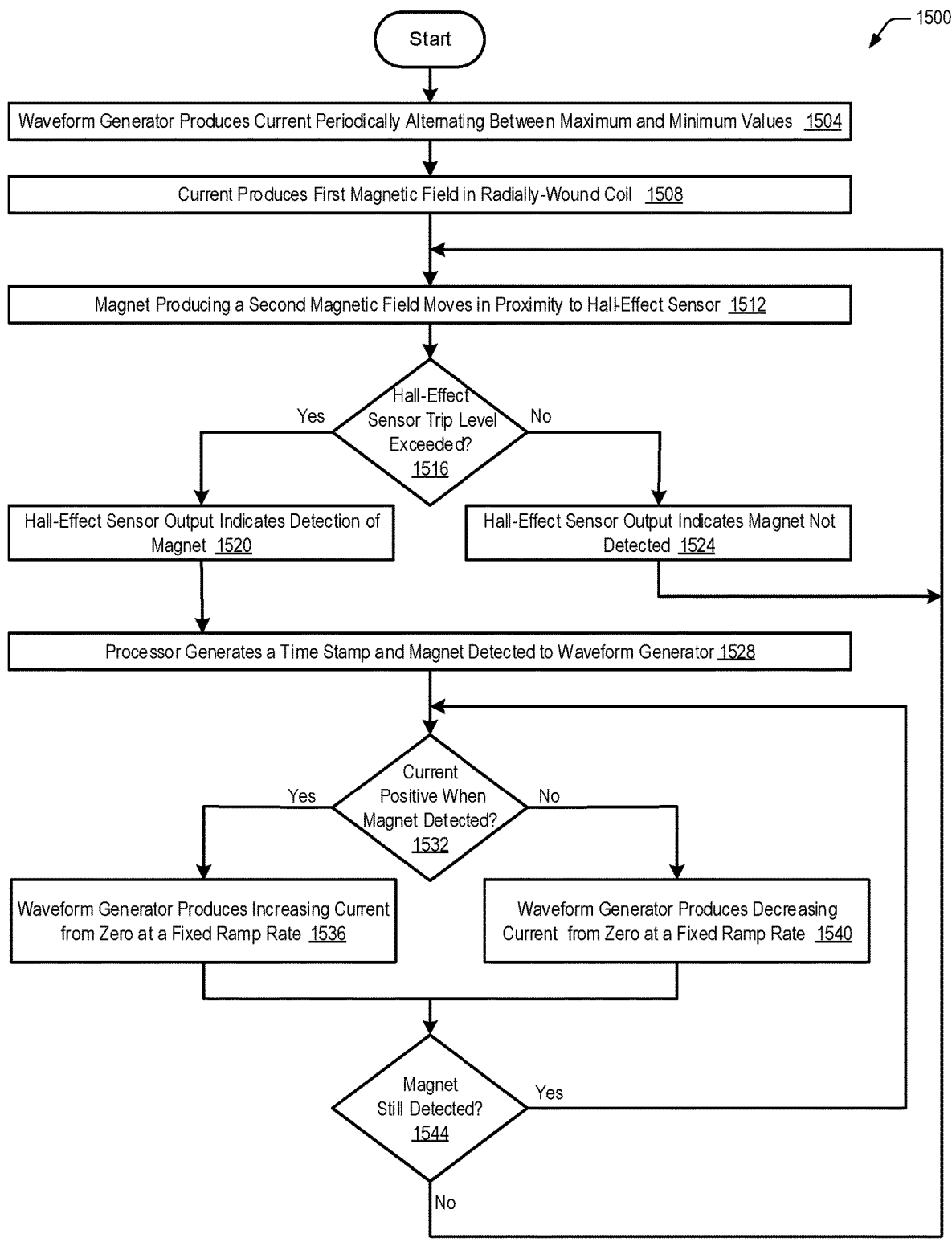
FIG. 15 is a flowchart illustrating a process for generating current waveforms to detect and find a range to a magnet, in accordance with the third embodiment of the present application.

Referring now to FIG. 15, a flowchart for generating current waveforms to detect and find a range to a magnet 1500, in accordance with the third embodiment of the present application is shown. The process of FIG. 15 determines a distance, and possibly also a time stamp, at each sampling time 1204 while the magnet 104 is detected. Flow begins at block 1504.

At block 1504, a waveform generator 1008 produces a current 140A periodically alternating between maximum and minimum values. In one embodiment, the maximum value is the positive value 1104 and the minimum value is the negative value 1108. Flow proceeds to block 1508.

At block 1508, the current 140A produces a first magnetic field 704 in a radially-wound coil 108. The radially-wound coil 108 is in fixed proximity to a hall-effect sensor 112. Flow proceeds to block 1512.

At block 1512, magnet 104 producing a second magnetic field 708 moves within a proximity to the hall-effect sensor 112. The proximity defines a sensing distance from the hall-effect sensor 112, although "in proximity to the hall-effect sensor 112" does not by itself imply the magnet 104 has been detected—that is established in decision block 1516. Flow proceeds to decision block 1516.

At decision block 1516, a determination is made if a trip level 716 of the hall-effect sensor 112 has been exceeded. If the trip level 716 has been exceeded, then the magnet 104 is detected and flow proceeds to block 1520. If the trip level 716 has not been exceeded, then the magnet 104 has not been detected and flow instead proceeds to block 1524. The trip level 716 is discussed in detail with respect to FIGS. 7A-7D.

At block 1520, the output 144 of the hall-effect sensor 112 indicates detection of the magnet 104. Flow proceeds to block 1528.

At block 1524, the output 144 of the hall-effect sensor 112 does not indicate detection of the magnet 104. Flow proceeds to block 1512.

At block 1528, the processor 212 generates a magnet detected signal 1012 to the waveform generator 1008 a time stamp. The processor 212 generates the magnet detected signal 1012 in response to comparator output 232 indicates magnet 104 detection. Flow proceeds to decision block 1532.

At decision block 1532, the waveform generator 1008 determines if the current 140A is positive when the magnet 104 is detected. If the current 140A is positive when the magnet 104 is detected, then flow proceeds to block 1536. If instead the current 140A is not positive (i.e. it is negative) when the magnet 104 is detected, then flow instead proceeds to block 1540.

At block 1536, the waveform generator 1008 produces current 140B/140D/140F that increases from zero at a fixed ramp rate. In one embodiment, the current 140B/140D/140F is produced with a fixed period while the magnet 104 is detected. In another embodiment, the current 140B/140D/140F is produced with variable timing depending on change in detected magnet 104 distance. Flow proceeds to decision block 1544.

At block 1540, the waveform generator 1008 produces current 140C/140E/140G that decreases from zero at the fixed ramp rate. In one embodiment, the current 140C/140E/140G is produced with a fixed period while the magnet 104 is detected. In another embodiment, the current 140C/140E/140G is produced with variable timing depending on change in detected magnet 104 distance. Flow proceeds to decision block 1544.

At decision block 1544, the processor 212 determines if the magnet 104 is still detected. If the magnet 104 is still detected, then flow proceeds to decision block 1532. If instead the magnet 104 is not still detected, then flow instead proceeds to decision block 1512.

Figure 16:
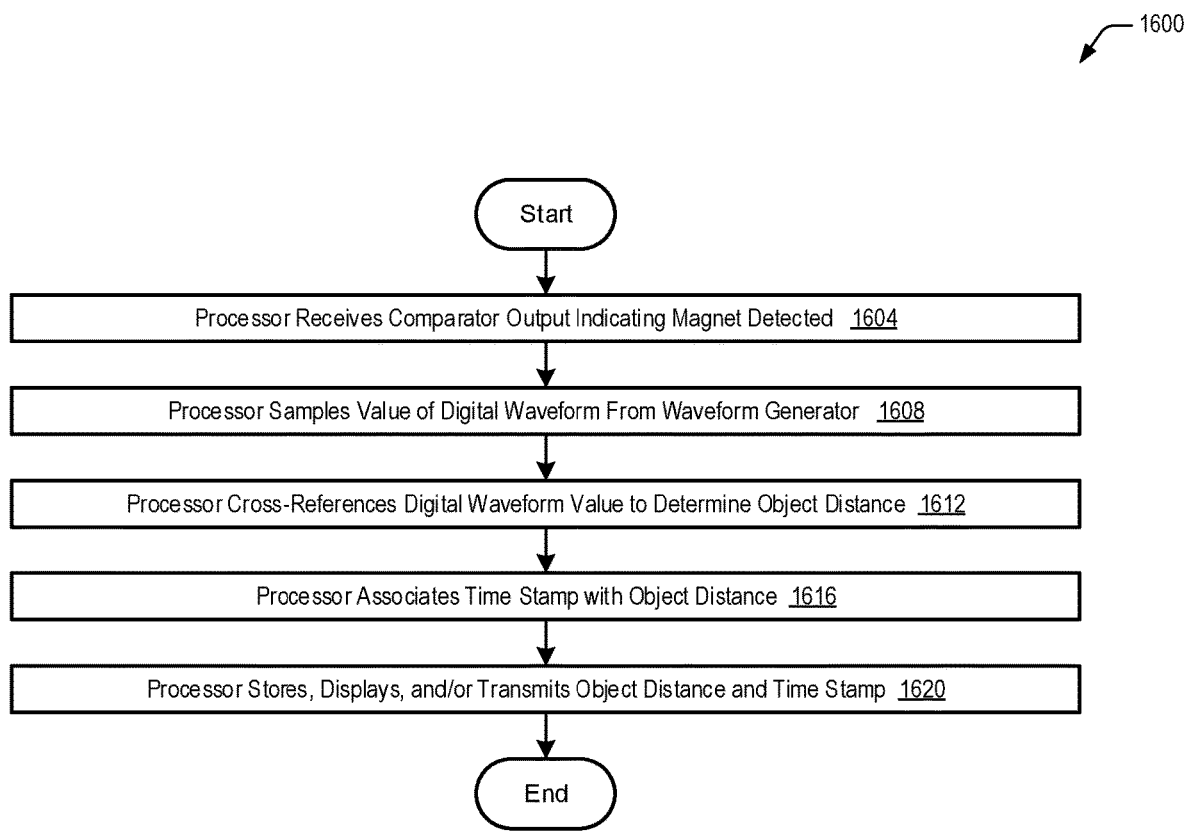
FIG. 16 is a flowchart illustrating a process for calculating distance and/or time stamps for a detected magnet.

Referring now to FIG. 16, a flowchart illustrating a process for calculating distance and/or time stamps for a detected magnet 1600 is shown. Flow begins at block 1604.

At block 1604, a processor 212 receives a comparator output 232 indicating a magnet 104 is detected. Flow proceeds to block 1608.

At block 1608, the processor 212 samples the value of a digital waveform 1016 from the waveform generator 1008. Flow proceeds to block 1612.

At block 1612, the processor 212 cross-references the digital waveform 1016 value to determine an object distance for the magnet 104, where the object distance is the current distance between the magnet 104 and the hall-effect sensor 112. Flow proceeds to block 1616.

At block 1616, the processor associates a time stamp with the object distance. The time stamp reflects a time that the digital waveform 1016 was sampled for the current distance measurement. Flow proceeds to block 1620.

At block 1620, the processor 212 stores, displays, and/or transmits the current object distance and/or time stamp 1020. A group of these data items may provide a record of the magnet 104 movement over time. Flow ends at block 1620.

Finally, those skilled in the art should appreciate that they can readily use the disclosed conception and specific embodiments as a basis for designing or modifying other structures for carrying out the same purposes of the present application without departing from the spirit and scope of the application as defined by the appended claims.

It will be readily understood that the components of the application, as generally described and illustrated in the figures herein, may be arranged and designed in a wide variety of different configurations. For example, both active-low and active high logic is shown and described at various points within the present application. However, those may be viewed as arbitrary choices and in different instantiations may be better implemented with different or opposite logic than as shown. Thus, the detailed description of the embodiments is not intended to limit the scope of the application as claimed, but is merely representative of selected and exemplary embodiments of the application.

One having ordinary skill in the art will readily understand that the application as discussed above may be practiced with steps in a different order, and/or with hardware elements in configurations that are different than those which are specifically disclosed. Therefore, although the application has been described based upon these preferred embodiments, it would be apparent to those of skill in the art that certain modifications, variations, and alternative constructions would be apparent, while remaining within the spirit and scope of the application. In order to determine the metes and bounds of the application, therefore, reference should be made to the present claims.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

I claim:

1. A device comprising:
    a radially-wound coil configured to produce a first magnetic field in response to a current applied to the coil;
    a hall-effect sensor comprising a sensor output that indicates proximity of a magnet to the hall-effect sensor, the magnet provides a second magnetic field and the sensor output indicates proximity in response to a combination of a strength of the first magnetic field and a strength of the second magnetic field exceeds a trip level, the coil in fixed proximity to the hall-effect sensor, the current configured to control a polarity of the first magnetic field to detect the magnet;
    a power source, coupled to the hall-effect sensor, configured to provide power that alternates between on and off voltages to the hall-effect sensor; and
    a control circuit, coupled to the hall-effect sensor, configured to:
        determine a time stamp that corresponds to a sample time the sensor output indicates detection of the magnet after the sensor output does not indicate detection of the magnet;
        sample a value that corresponds to the current at the sample time;
        determine a sensed distance to the magnet from the sampled value.

2. The device of claim 1, wherein the radially-wound coil in fixed proximity to the hall-effect sensor comprises the radially wound coil in a centered and coaxial orientation with respect to the hall-effect sensor and the radially-wound coil separated from the hall-effect sensor by not more than a separation distance.

3. The device of claim 1, wherein the control circuit is configured to control the polarity of the first magnetic field comprises the current symmetrically alternates between a positive and a negative value at a predetermined frequency in response to the sensor output does not indicate detection of the magnet and the current increases or decreases from a zero value at a fixed rate in response to the sensor output indicates detection of the magnet.

4. The device of claim 3, wherein in response to the current is at the positive value when the magnet is detected, the control circuit is configured to increase the current from the zero value at the fixed rate while the magnet is detected, wherein in response to the current is at the negative value when the magnet is detected, the control circuit is configured to decrease the current from the zero value at the fixed rate while the magnet is detected.

5. The device of claim 1, wherein an on time for the on voltage and an off time for the off voltage-of the power source corresponds to a maximum turn on time specification for the hall-effect sensor.

6. The device of claim 1, wherein the control circuit biases the first magnetic field through the current to a bias level just below the trip level, wherein the strength of the second magnetic field depends on characteristics of magnets to be detected, the characteristics comprising the strength of the magnet, an orientation of the magnet to the radially-wound coil, and the sensed distance.

7. The device of claim 1, wherein the sensed distance is from the hall-effect sensor to the magnet within a sense range, wherein the control circuit performs one or more of store, display, and transmit the time stamp and the sensed distance.

8. A system, comprising:
a sense circuit, comprising:
- a radially-wound coil configured to produce a first magnetic field in response to a current applied to the coil; and
- a hall-effect sensor comprising a sensor output comprising a trip level, the radially-wound coil in fixed proximity to the hall-effect sensor;

a power source, coupled to the hall-effect sensor, configured to provide power that alternates between on and off voltages to the hall-effect sensor;

a magnet that produces a second magnetic field, the magnet configured to move in one or more directions with respect to the hall-effect sensor, the sensor output indicates proximity of the magnet to the hall-effect sensor in response to a combination of a strength of the first magnetic field and a strength of the second magnetic field at the hall-effect sensor exceeds the trip level; and a control circuit, coupled to the sense circuit, configured to:
- produce the current to the radially-wound coil;
- modulate the current to control the polarity of the first magnetic field;
- sample the current at a sample time the sensor output initially indicates detection of the magnet after the sensor output does not indicate detection of the magnet; and
- determine a sensed distance to the magnet from the sample.

9. The system of claim 8, wherein the radially-wound coil in fixed proximity to the hall-effect sensor comprises the radially wound coil in a centered and coaxial orientation with respect to the hall-effect sensor, the radially-wound coil separated from the hall-effect sensor by not more than a separation distance.

10. The system of claim 8, wherein the control circuit controls the polarity of the first magnetic field comprises one of:
- in response to the sensor output does not indicate detection of the magnet, the control circuit is configured to symmetrically alternate the current between a same positive and a negative value at a predetermined frequency;
- in response to the sensor output indicates the magnet is detected while the current is at the positive value, the control circuit is configured to increase the current from a zero value at a fixed rate; and
- in response to the sensor output indicates the magnet is detected while the current is at the negative value, the control circuit is configured to decrease the current from the zero value at the fixed rate.

11. The system of claim 8, wherein an on time for the on voltage and an off time for the off voltage-of the power source corresponds to a maximum turn on time specification for the hall-effect sensor.

12. The system of claim 8, wherein the control circuit biases the first magnetic field through the current to a bias level just below the trip level, wherein the strength of the second magnetic field depends on characteristics of magnets to be detected, the characteristics comprising the strength of the magnet, an orientation of the magnet to the radially-wound coil, and the sensed distance.

13. The system of claim 8, wherein the control circuit is further configured to:
- determine a time stamp that corresponds to a sample time of the sample; and
- associate the time stamp with the sample.

14. The system of claim 13, wherein the sensed distance is from the hall-effect sensor to the magnet within a sense range, wherein the control circuit performs one or more of store, display, and transmit the time stamp and the sensed distance.

15. A method, comprising:
- providing power comprising an on voltage for an on time and an off voltage for an off time to a hall-effect sensor;
- producing, by a control circuit, a current to a radially-wound coil;
- producing a first magnetic field in the radially-wound coil by modulating the current, the current providing a bias level for the hall-effect sensor in fixed proximity to the radially-wound coil, the hall-effect sensor comprising a sensor output;
- moving a magnet producing a second magnetic field within a detection range of the hall-effect sensor;
- indicating detection of the magnet, by the sensor output, in response to a combination of a strength of the first magnetic field and a strength of the second magnetic field exceeds a trip level of the hall-effect sensor, the trip level being higher than the bias level;
- sampling the current at a time when the sensor output initially indicates detection of the magnet after not detecting the magnet; and
- determining a sensed distance to the magnet from the sample.

16. The method of claim 15, wherein the radially-wound coil in fixed proximity to the hall-effect sensor comprises the radially wound coil being in a centered and coaxial orientation with respect to the hall-effect sensor, the radially-wound coil separated from the hall-effect sensor by not more than a separation distance.

17. The method of claim 15, wherein modulating the current comprising one of:
- in response to the sensor output not indicating detection of the magnet, the control circuit symmetrically alternating the current between a same positive and a negative value at a predetermined frequency;
- in response to the sensor output indicating detection of the magnet while the current is at the positive value, the control circuit increasing the current from a zero value at a fixed rate; and
- in response to the sensor output indicating detection of the magnet while the current is at the negative value, the control circuit decreasing the current from the zero value at the fixed rate.

18. The method of claim 15, wherein the on time and the off time corresponding to a maximum turn on time specification for the hall-effect sensor.

19. The method of claim 15, further comprising:
- biasing the first magnetic field through the current to a bias level just below the trip level, wherein the strength of the second magnetic field depends on characteristics of magnets to be detected, the characteristics comprising the strength of the magnet, an orientation of the magnet to the radially-wound coil, and the sensed distance.

20. The method of claim 15, further comprising:
- determining, by the control circuit, a time stamp corresponding to a sample time of the sample;
- associating the time stamp with the sample; and
- performing, by the control circuit, one or more of storing, displaying, and transmitting one or more of the time stamp and the sensed distance.

wherein the sensed distance is from the hall-effect sensor to the magnet within a sensing range.

* * * * *